US008156299B2

(12) United States Patent
Okin et al.

(10) Patent No.: US 8,156,299 B2
(45) Date of Patent: Apr. 10, 2012

(54) MANAGING MEMORY SYSTEMS CONTAINING COMPONENTS WITH ASYMMETRIC CHARACTERISTICS

(75) Inventors: Kenneth A. Okin, Saratoga, CA (US); Vijay Karamcheti, Los Altos, CA (US)

(73) Assignee: Virident Systems Inc., Milpitas, CA (US)

( * ) Notice: Subject to any disclaimer, the term of this patent is extended or adjusted under 35 U.S.C. 154(b) by 578 days.

(21) Appl. No.: 12/254,767

(22) Filed: Oct. 20, 2008

(65) Prior Publication Data
US 2009/0106479 A1 Apr. 23, 2009

Related U.S. Application Data

(60) Provisional application No. 60/981,284, filed on Oct. 19, 2007.

(51) Int. Cl.
*G06F 12/02* (2006.01)
(52) U.S. Cl. ........ 711/165; 711/101; 711/103; 711/170; 711/203; 711/E12.002
(58) Field of Classification Search ........................ None
See application file for complete search history.

(56) References Cited

U.S. PATENT DOCUMENTS

| | | | |
|---|---|---|---|
| 5,748,528 A * | 5/1998 | Campardo et al. ....... 365/185.13 |
| 6,170,047 B1 | 1/2001 | Dye | |
| 6,240,501 B1 | 5/2001 | Hagersten | |
| 6,260,103 B1 * | 7/2001 | Alexis et al. .................. 711/103 |
| 6,370,631 B1 | 4/2002 | Dye | |
| 6,772,273 B1 * | 8/2004 | Tedrow et al. ................ 711/103 |
| 6,851,026 B1 * | 2/2005 | Roohparvar .................. 711/150 |
| 7,046,559 B2 * | 5/2006 | Saito ......................... 365/185.33 |
| 7,080,193 B2 * | 7/2006 | Roohparvar ................... 711/103 |
| 7,562,180 B2 * | 7/2009 | Gyl et al. ....................... 711/103 |
| 2001/0042160 A1 * | 11/2001 | Yamada ......................... 711/104 |
| 2002/0016891 A1 | 2/2002 | Noel et al. | |
| 2002/0046891 A1 | 4/2002 | Honda et al. | |
| 2005/0132130 A1 * | 6/2005 | Hasegawa et al. ............ 711/103 |
| 2005/0235131 A1 * | 10/2005 | Ware .............................. 711/203 |
| 2005/0262291 A1 * | 11/2005 | Siegelin et al. ............... 711/103 |
| 2006/0221756 A1 * | 10/2006 | Miura et al. .............. 365/230.03 |
| 2007/0217253 A1 * | 9/2007 | Kim et al. ...................... 365/163 |
| 2007/0258313 A1 * | 11/2007 | Yu et al. .................... 365/230.05 |

OTHER PUBLICATIONS

Gary L. Peterson. 1983. Concurrent Reading While Writing. ACM Trans. Program. Lang. Syst. 5, 1 (Jan. 1983), 46-55.*

(Continued)

*Primary Examiner* — Edward Dudek, Jr.
*Assistant Examiner* — Ralph A Verderamo, III
(74) *Attorney, Agent, or Firm* — Fish & Richardson P.C.

(57) ABSTRACT

A memory controller (MC) is associated with a remapping table to enable access to content in a memory system that includes asymmetric memory. The MC receives a request for a memory read or an Input/Output (I/O) write from a central processing unit (CPU) for a physical address specified by the system's memory management unit (MMU). The CPU uses the MMU to manage memory operations for the CPU, by translating the virtual addresses associated with CPU instructions into physical addresses representing system memory or I/O locations. The MC for asymmetric memories is configured to process the MMU-specified physical addresses as an additional type of virtual addresses, creating a layer of abstraction between the physical address specified by the MMU and the physical memory address with which that address is associated by the MC. The MC shields the CPU from the computational complexities required to implement a memory system with asymmetric components.

29 Claims, 19 Drawing Sheets

OTHER PUBLICATIONS

Maurice Herlihy. 1991. Wait-free synchronization. ACM Trans. Program. Lang. Syst. 13, 1 (Jan. 1991), 124-149.*

Wedde, H.F.; Bohm, S.; Freund, W.; , "Concurrent read/write: real-time theory and practice," Object-Oriented Real-Time Distributed Computing, 2001. ISORC—2001. Proceedings. Fourth IEEE International Symposium on , vol., No., pp. 201-208, 2001.*

Wedde, H.F.; Korel, B.; Lind, J.; , "Highly Integrated Task and Resource Scheduling for Mission-Critical Systems," Real-Time Systems, 1993. Proceedings., Fifth Euromicro Workshop on , vol., No., pp. 190-195, Jun. 22-24, 1993.*

Dunn, C.; Kaya, C.; Lewis, T.; Strauss, T.; Schreck, J.; Hefley, P.; Middendorf, M.; San, T.; , "Flash EPROM disturb mechanisms," Reliability Physics Symposium, 1994. 32nd Annual Proceedings., IEEE International , vol., No., pp. 299-308, Apr. 11-14, 1994.*

Doyle, W.; Josephs, R.; , "The read-write disturb problem in plated wire memories," Magnetics, IEEE Transactions on , vol. 8, No. 3, pp. 306-309, Sep. 1972.*

Wedde, H.F.; Mengdai Hu; , "Scheduling Critical And Sensitiue Tasks With Remote Requests in Mission-critical Systems," Real-Time Systems, 1992. Proceedings., Fourth Euromicro workshop on , vol., No., pp. 202-207, Jun. 3-5, 1992.*

International Search Report and Written Opinion for International Application No. PCT/US08/080559, mailed Dec. 22, 2008.

U.S. Non-Final Office Action for U.S. Appl. No. 12/254,779 mailed Jul. 21, 2011, 21 pages.

* cited by examiner

300

| MMU Addresses | MC Addresses |
|---|---|
| 0100 | Read: 1100<br>Write: 2100 |
| 0200 | Read 1200<br>Write 2200 |

310 ← (left column)
320 → (right column)

FIG. 3

PHYSICAL ADDRESS CONSTRUCTION

600

A memory controller receives, from a memory management unit within a central processing unit (CPU), a request for an Input/Output (I/O) write to a first memory management unit-specified physical address (610)

↓

The memory controller accesses a remapping table associated with a memory controller (620)

↓

The memory controller uses the remapping table to identify a first memory controller-specified physical address associated with the first memory management unit-specified physical address, the first memory controller-specified physical address corresponding to a first location within asymmetric memory storage (630)

↓

The memory controller identifies a first bank of storage within the asymmetric memory storage that includes the first location, the first bank of storage including a disruption region that is associated with characteristics that include corrupted content or nondeterministic read latency as a result of attempting to read data from the first bank of storage as an I/O write is being performed that involves the first bank of storage (640)

↓

The memory controller then writes contents from the first bank of storage to a second bank of storage (650)

↓

Between a time when the contents from the first bank of storage begin to be written to the second bank of storage and before a time when the contents to be written have been written to the second bank of storage, read instructions from the memory management unit for requested content associated with a second memory management unit-specified physical address may be serviced by reading the requested content from the first bank of storage (660)

↓

The memory controller configures the remapping table to associate the first memory management unit-specified physical address with a second memory controller-specified physical address corresponding to the second bank of storage after determining that the contents have been written to the second bank of storage (670)

| The memory controller identifies a first bank of asymmetric storage, the first bank representing a first disruption region (710A) |
|---|

↓

| The memory controller identifies a second bank of asymmetric storage, the second bank representing a second disruption region that is separate from the first disruption region (720A) |
|---|

↓

| The memory controller associates the first bank of asymmetric storage with the second bank of asymmetric storage, with a first sector, a second sector, and a third sector in the first bank, including data that mirrors data within a first sector, a second sector, and a third sector of the second bank (730A) |
|---|

↓

| The memory controller receives a first update to be written to the memory system (740A) |
|---|

↓

| The memory controller writes the first update to a fourth sector of the second bank that follows the third sector of the first bank (750A) |
|---|

↓

| The memory controller disables read accesses to the first sector, the second sector, and the third sector of the second bank while writing the fourth sector to the second bank (760A) |
|---|

↓

| The memory controller enables data to be read from the first sector, the second sector, and the third sector of the first bank while writing the update to fourth sector to the second bank (770A) |
|---|

↓

| The memory controller writes the first update to the fourth sector of the first bank (780A) |
|---|

↓

| The memory controller disables read access to the first sector, the second sector, and the third sector of the first bank while writing the fourth sector to the first bank (790A) |
|---|

↓

| The memory controller enables data to be read from the first sector, the second sector, and the third sector of the second bank while writing the update to the fourth sector to the first bank (795A) |
|---|

A memory controller receives an instruction to write a value to a first memory management unit-specified physical address (810A)

↓

The memory controller determines that the first memory management unit-specified physical address is associated with a memory controller-specified physical address for asymmetric memory and queues the write instruction (820A)

↓

The memory controller then copies the data from a first region proximate to the memory controller-specified physical address that is an active region to a second region (830A)

↓

The memory controller then modifies the remapping table so that read access to the content of the first region is still enabled, and writes the value to the second region (840A)

↓

Once the writing is completed, the memory controller reconfigures the remapping table to identify the second region as the active region for the content previously stored in the first region and the value associated with the first memory management unit-specified physical address (850A)

MANAGING MEMORY SYSTEMS CONTAINING COMPONENTS WITH ASYMMETRIC CHARACTERISTICS

CROSS-REFERENCE TO RELATED APPLICATIONS

This application claims priority to U.S. Application Ser. No. 60/981,284, entitled "MANAGING MEMORY SYSTEMS CONTAINING COMPONENTS WITH ASYMMETRIC CHARACTERISTICS", and filed on Oct. 19, 2007.

BACKGROUND

Computer systems may move objects into memory for ready availability to one or more processors. Similarly, objects may be moved out of memory to enable other objects to re-use the space in memory.

BRIEF DESCRIPTIONS OF THE DRAWINGS

FIG. 3 is a block diagram of a remapping (remap) table associated with a memory controller.

FIG. 6 is a flow chart of a process by which a memory controller enables access to a memory system that includes asymmetric memory.

FIG. 7A is a flow chart of a process for managing storage of data in a memory system that includes asymmetric memory.

FIG. 8A is a flow chart of a process by which data is queued in order to write the data to a memory system that includes asymmetric memory and symmetric memory.

SUMMARY

Figure 1:
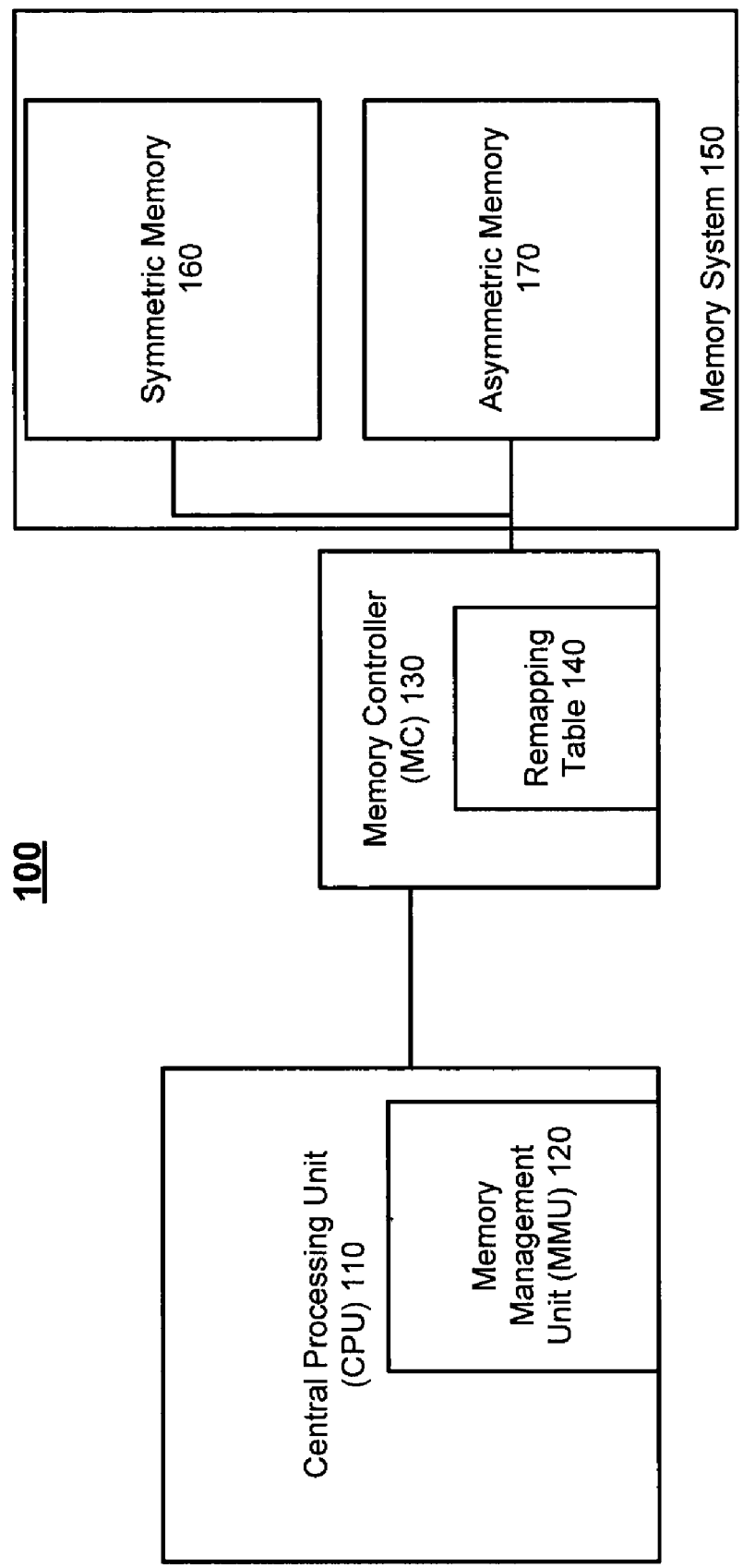
FIG. 1 is a block diagram of a central processing unit (CPU) that interfaces with a memory system through a memory controller.

In one general sense, a method of enabling a memory controller associated with a remapping table to enable access to content in a memory system that includes asymmetric memory. A request for an Input/Output (I/O) write to a first memory management unit-specified physical address is received at the memory controller. A remapping table associated with a memory controller is accessed. The remapping table is used to identify a first memory controller-specified physical address associated with the first memory management unit-specified physical address, the first memory controller-specified physical address corresponding to a first location within asymmetric memory storage. A first disruption region within the asymmetric memory storage is identified that includes the first location. Contents are written from the first disruption region to a second disruption region. The memory controller is configured to process, between a time when the contents from the first disruption region begin to be written to the second disruption region and before a time when writing of the contents to be written to the second disruption region has been completed, read instructions from the memory management unit for requested content associated with a second memory management unit-specified physical address that is associated with the disruption region for the first memory-management unit specified physical address by reading the requested content from the first disruption region. The remapping table is configured to associate the first memory management unit-specified physical address with a second memory controller-specified physical address corresponding to the second disruption region after determining that the contents have been written to the second disruption region, wherein the first disruption region and the second disruption region include physical addresses that are associated with characteristics that include corrupted content or nondeterministic read latency as a result of attempting to read data from the physical addresses concurrent with an I/O write being performed involving the physical addresses.

Implementations may include one or more of the following features. For example, the request for the I/O write may be processed by writing data associated with the request for the I/O write to the second disruption region. The memory controller may be configured to process write instructions, from the memory management unit, to write to the second disruption region until a prior write operation has been completed. The memory controller may be leveraged to align the first disruption region and the second disruption region, including, after the data in the first disruption region has been written to the second disruption region, using the memory controller to write at least data newly-written to the second disruption region and distinct of data within the first disruption region to the first disruption region. The memory controller may be used to process read instructions, as the data from the second disruption region is being written to the first disruption region, from the memory management unit for data residing in the first disruption region by reading from the second disruption region until the contents have been written to the first disruption region.

The memory controller may be leveraged to align the first disruption region and the second disruption region so that transferring the data between the first disruption region and the second disruption region only reflects the content that has been updated. The memory controller may be configured to receive, from the memory management unit, a write instruction related to data that resides in the first disruption region, queue the write instruction until the contents have been written to the second disruption region, and execute the write instruction in response to determining that the contents have been written to the second disruption region.

Two memory controller-specified physical addresses for the memory management unit-specified physical address may be identified in the memory controller as the data in the first disruption region is being written to the second disruption region. A first memory controller-specified physical address associated with the first disruption region may be used to process read instructions for data associated with the memory management unit-specified physical address. The second memory controller-specified physical address associated with the second disruption region may be used to process write instructions for data associated with the memory management unit-specified physical address.

It may be detected that the write instruction to the second memory controller-specified physical address is associated with a disruption region and the write instruction to the second memory controller-specified physical address may be queued until the second memory controller-specified physical address no longer represents a disruption region. An asymmetric memory physical address information for the memory system may be exchanged across an interconnection using the memory controller. The requested data may be automatically loaded across the interconnection in response to receiving a read instruction from the memory management unit using the asymmetric memory physical address information.

Receiving, at the memory controller, the request for the Input/Output (I/O) write from the memory management unit-specified physical address may include receiving the request for the I/O write on a Dual Inline Memory Module (DIMM), and routing the request for the I/O block write to a memory controller embedded within the DIMM. Identifying the first disruption region may include identifying multiple areas of organized memory across multiple areas on a single device. Identifying the first disruption region may include identifying multiple areas on multiple devices that are organized around a memory controller-specified physical address in the remapping table. Accessing a remapping table associated with a memory controller may include accessing a read translation table that is physically coupled to the asymmetric memory to exchange the first memory controller-specified physical address, and accessing a write translation table that is physically coupled to the asymmetric memory to exchange the first memory controller-specified physical address.

Accessing a remapping table associated with the memory controller may include accessing a read translation table that is physically coupled to the asymmetric memory to exchange the first memory controller-specified physical address, and accessing a write translation table that is stored in a different location than the read location table, where the read translation table is physically coupled to the asymmetric memory to exchange the first memory controller-specified physical address.

Accessing the remapping table associated with the memory controller may include accessing a read translation portion of the remapping table that is implemented as part of the memory controller logic to perform read operations, and accessing a write translation portion of the remapping table that is implemented as a software-managed table in order to perform write operations. Accessing the write translation portion of the remapping table that is implemented as the software-managed table in order to perform write operations may include accessing the write translation portion of the remapping table that is implemented in association with an application, a hypervisor, an operating system, a CPU, or a memory controller. Accessing a remapping table associated with a memory controller may include accessing the remapping table that is embedded as a DIMM-based memory controller.

Accessing a remapping table associated with a memory controller may include accessing several divided tables, where each of the divided tables are associated with two or more disruption regions within a DIMM. Receiving, at the memory controller, the request for the Input/Output (I/O) write to the first memory management unit-specified physical address may include receiving, at the memory controller and from the memory management unit within the central processing unit (CPU), the request for an Input/Output (I/O) write to the first memory management unit-specified physical address.

Receiving, at the memory controller, the request for the Input/Output (I/O) write to the first memory management unit-specified physical address may include receiving, at the memory controller and from a system different than the memory management unit within the central processing unit (CPU), the request for an Input/Output (I/O) write to the first memory management unit-specified physical address. The memory controller may be configured to interface with symmetric memory and the asymmetric memory.

The memory controller may be configured to interface with only the asymmetric memory. The memory controller may be configured to operate in a distributed mode, wherein the memory controller is configured to perform read translations using memory controller logic, and perform write operations using a portion of the remapping table implemented as a software-managed table residing with an application, a hypervisor, an operating system, a CPU, or a memory controller.

The asymmetric memory may include NOR flash memory and using the remapping table to identify the first memory controller-specified physical address associated with the first memory management unit-specified physical address, the first memory controller-specified physical address corresponding to the first location within the asymmetric memory storage may include using the remapping table to identify the first memory controller-specified physical address associated with the first memory management unit-specified physical address, the first memory controller-specified physical address corresponding to the first location within the NOR flash memory.

The asymmetric memory may include phase change memory and wherein using the remapping table to identify the first memory controller-specified physical address associated with the first memory management unit-specified physical address, the first memory controller-specified physical address corresponding to the first location within the asymmetric memory storage may include using the remapping table to identify the first memory controller-specified physical address associated with the first memory management unit-specified physical address, the first memory controller-specified physical address corresponding to the first location within the phase change memory.

The first disruption region may include a first bank within NOR flash memory and the second disruption region may include a second bank within the NOR flash memory, and wherein identifying a first disruption region includes identifying the first bank within the NOR flash memory.

The various aspects, implementations, and features may be implemented using, for example, one or more of a method, an apparatus, a system, an apparatus, system, tool, or processing device for performing a method, a program or other set of instructions, an apparatus that includes a program or a set of instructions, and a computer program embodied in a tangible computer readable medium. The tangible computer readable medium may include, for example, instructions, software, images, and other data.

DETAILED DESCRIPTION

A recent increase in mobile telecommunications device usage has made asymmetric memory systems (e.g., NOR flash memory) more readily available. Leveraging this increased availability, our engineers are able to design systems that use asymmetric memory as a portion of CPU's main memory. For example, NOR flash memory may be used in the main memory of a server acting as a search engine.

However, asymmetric memory has pronounced access characteristics that give rise to the label "asymmetric." A system using asymmetric memory must account for the different access characteristics in order to maximize performance. For example, in the case of some types of NOR flash, the access characteristics for read operations can resemble access characteristics for DRAM (Dynamic Random Access Memory), where read operations for both NOR flash and DRAM require roughly comparable time to retrieve content requested in an address. In contrast, write operations for some types of NOR flash differ dramatically from write characteristics for DRAM. Unlike DRAM, some types of NOR flash cannot perform write operations to data in a random access manner initiated by a single CPU-level store instruction. In addition, NOR flash requires an additional long-running erase operation prior to a write. Thus, writing to NOR flash memory typically requires more time (several orders of magnitude longer) than writing to DRAM.

Another aspect of NOR flash-like asymmetric memories is that write operations are associated with a disruption region. A disruption region represents the area proximate to a particular address on a NOR flash, which area is actually (or deemed likely to be) associated with undesirable behavior when a memory controller writes or erases to the particular address. In one instance, writing to a particular address causes the NOR flash to corrupt data at other addresses in the disruption region. In another instance, the disruption region does not return timely results in response to requesting data from other addresses in the disruption region. In still another instance, accesses to other data in the disruption region returns the correct data in the appropriate time, but does so on an inconsistent basis, so that a system designed cannot rely on access to the NOR flash memory system without experiencing difficulties.

Thus, a system using NOR flash memory as part of a system's main memory uses a memory controller that protects other components in the system from experiencing performance challenges resulting from the access characteristics of NOR flash (or other asymmetric memory systems). For example, the memory controller defines or observes disruption regions within NOR flash, enabling data residing in a disruption region to remain available for reading from an original location with consistent read times, amidst writing of data associated with that same location to another memory region that will later serve read requests.

A memory controller (MC) may be associated with a remapping table to enable access to content in a memory system that includes asymmetric memory and symmetric memory. The MC receives a request for a memory read or an Input/Output (I/O) write from a central processing unit (CPU) for a physical address specified by the system's memory management unit (MMU). The CPU uses the MMU to manage memory operations for the CPU, by translating the virtual addresses associated with CPU instructions into physical addresses representing system memory or I/O locations. However, the MC for asymmetric memories is configured to process the MMU-specified physical addresses as an additional type of virtual addresses, creating a layer of abstraction between the physical address specified by the MMU and the physical memory address with which that address is associated by the MC. In this sense, the MC provides a uniform memory structure to the MMU and shields the CPU from the computational complexities required to implement a memory system that may include symmetric and asymmetric components.

A remapping table is used by the MC to enable its abstraction (or virtualization). Generally, the remapping table associates MMU-specified physical addresses (bus addresses) with the actual physical address for the particular memory location in the memory system. The remapping table is used to identify a first MC-specified physical address associated with the MMU-specified physical address, where the first MC-specified physical address is said to correspond to a first location within an asymmetric memory storage. For example, the MC may associate bus address A from the MMU with physical address D for a NOR flash memory system.

With this structure, when data is to be written, an instruction from the CPU that implicates a physical address (e.g., physical address A) specified by the MMU is translated by the remap table of the MC as an address within a memory system. Assuming that NOR flash is used in the memory system, the address is used to identify a disruption region corresponding thereto. And, in keeping with the above example, the MC associates the MMU-specified physical address, i.e., physical address A, is used by the MC to identify a first disruption region (e.g., a bank in NOR flash memory) within the asymmetric memory storage that includes location D. In representing a disruption region for NOR flash devices, the first bank of storage is associated with characteristics that include corrupted content or nondeterministic read latency as a result of attempting to read data from the first bank of storage at the same time as an I/O (block) write is being performed that involves the first bank of storage. To further illustrate, the MC may determine that NOR flash physical addresses beginning with 01000 and lasting until 09000 represent the disruption region. For example, physical addresses at location D ("physical address D") may be associated with one or more of these specific addresses.

The MC then executes the write instruction directed to physical address D by writing content from the first bank of storage to a second bank of storage which is currently unused by any CPU, and adding or modifying content, per the instruction, leaving the first bank unchanged and available for read access while doing so. For example, and again in keeping with the above example, data in physical address range 01000-09000 remains available for read access while it, and updates to it, are written to physical address range 11000-19000. In greater detail, as the contents from the first bank of storage are being written to the second bank of storage and until the contents have been written to the second bank of storage, the MC is configured to process read instructions from the MMU for content residing in the first bank of storage by reading from the first bank of storage. In the example, while the data from physical addresses 01000-09000 are being copied to 11000-19000, the MC may process a request from the MMU to read physical address A by reading data from physical address 05000 instead of the duplicated and identical data residing in physical address 15000, which would represent a read to an impacted disruption region.

Yet, thereafter, in response to determining that the contents have been written to the second bank of storage, the remapping table is configured to associate the first MMU-specified bus address with a second MC-specified physical address related to the second bank of storage. For example, the MC may configure the remapping table to associate bus address A with physical addresses 11000-19000 in response to determining that the data from physical addresses 01000-09000 has been written. This would have the effect of processing subsequent reads to bus address A by reading data from physical address 15000.

In another implementation, a mirror disruption region is created or maintained, which is proactively kept up to date with an original disruption region. As a result, application performance may be increased because less data may need to be transferred at the time an update is received corresponding to the address range of the original disruption region. When a write instruction for MMU-specified physical address corresponding to a constituent data block within the original disruption region is received, one or more updates are made to a corresponding block within the region containing the mirrored copy, thus effecting the write instruction. Meanwhile, while the updates are being made to the mirrored copy, read access for blocks of the disruption region remains available. Once the updates to the mirrored copy are completed, the mirrored image is made available for read access. More specifically, the MC remap table replaces the constituent data block address with the address of the corresponding block, such that an ensuing read to the implicated MMU-specified physical address is directed to the mirrored, but now updated, data block.

FIG. 1 is a block diagram of a system 100 with a CPU 110 that interfaces with a memory system 150 through a MC 130. More precisely, the MC 130 is positioned, oriented, and configured to enable it to be leveraged in processing read and write requests from the MMU 120 to the memory system 150 while shielding the CPU 110 from challenges resulting from particular access characteristics associated with asymmetric memory 170.

The CPU 110 includes logic configured to implement one or more processing operations. Examples of a CPU 110 may include x86-based processors from Intel Inc. and Advanced Micro Devices Inc. (AMD), and/or ARM (TM) processors. The CPU 110 may include one or more processor cores.

Generally, each CPU 110 interfaces with an operating system. The operating system, in turn, may interface with one or more applications. These applications may include a search engine, business analytics, data mining, or a database management application. Each of these applications may be compiled (or interpreted) into different machine-level instructions for execution on the CPU 110. Although only one CPU 110 is shown, multiple CPUs may be used. Each CPU 110 supports an instruction set with a variety of instructions. These instructions may include, among other operations, register shifts, arithmetic operations, and memory operations. Examples of the memory operations may include random access read and write operations and block (I/O) read and write operations.

As shown, the CPU 110 includes a MMU 120. Generally, the MMU 120 is configured to manage a physical address space for the CPU 110. As the CPU 110 is executing a program, the CPU 110 may request to read data from a particular address and write data to a particular address. More precisely, the MMU 120 may be configured to receive a virtual address from the CPU 110 and translate the virtual address into a physical address (i.e., a MMU-specified physical address). In the case of a read, the CPU 110 may be configured to instruct the MMU 120 to retrieve data from a particular MMU-specified physical address. Other systems (e.g., the MC 130) may, in turn, process the MMU-specified physical address as an additional type of virtual address. In another configuration where a translation element of an MMU is separated out from the portion of the CPU that is responsible for interacting with the memory subsystem, the MMU may be configured to obtain the physical address associated with the virtual address. The MMU (or another entity in the CPU) then may be instructed to retrieve data from the MMU-specified physical address.

The MC 130 is logically oriented as an intermediary system to enable the CPU 110 to interface with a memory system 150. More precisely, the MC 130 is a system configured to receive read and write instructions with a MMU-specified physical address from the MMU 120, lookup a MC-specified physical address associated with the MMU-specified physical address, and perform the requested read and/or write instruction on the block(s) of physical memory corresponding to the MC-specified physical address.

The MC 130 includes logic (hardware and/or software) configured to manage the placement of and movement of data within a memory system 150. The MC 130 may be configured to dynamically process instructions based on a determination of whether the data and/or address is associated with symmetric memory or asymmetric memory. Similarly, the MC 130 may be configured to process read instructions in a first way, and process write instructions in a second way. For example, the MC 130 may be configured to permit read operations from the MMU that specify a particular address to leverage or otherwise operate on a first address within asymmetric memory, while concurrently processing write operations from the MMU that specify a particular address to leverage or otherwise operate on a second address within symmetric memory.

The MC 130 includes a physical interface to the memory system 150. The physical interface is configured to automatically exchange physical address information as the MC 130 interfaces with the memory system 150.

The MC 130 includes a remapping table 140 that stores an association between a MMU-specified physical address and a MC-specified physical address. The remapping table 140 may associate multiple MC-specified physical addresses with a MMU-specified physical address. For example, the remapping table 140 may be configured to indicate that writes to the disruption region should be directed to a "new" physical address range for the MMU, while reads from the disruption region should be directed to the "old" physical address range. Moreover, the remapping table 140 may indicate that a particular MMU-specified physical address is associated with a disruption region. For example, high-order address bits and some low-order bits in the MMU-supplied physical address may be analyzed to indicate which bank is being used. Alternatively, the MC may include logic (or include another column in a software table) that identifies the bank being used. Configuring the MC to have a bank identifier readily available may be used to reduce the processing burden of identifying a bank, for example, when performing write operations. The memory system 150 may include symmetric memory 160 and asymmetric memory 170. In one configuration, the memory system 150 includes only asymmetric memory 170 that is behind the MC 130. For instance, symmetric memory may be configured to interface with a first MC and asymmetric memory may be configured to interface with a second MC. The first MC may be configured to not include the remapping table and other components that are adapted to support the operations associated with the asymmetric memory 170. Alternatively or in addition, the MC 130 may be configured to support both symmetric memory 160 and the asymmetric memory 170. The memory system 150 may be packaged as one or more DIMMs (Dual Inline Memory Modules) and configured to support DIMM protocols, signaling, interconnects, and physical interfaces.

The symmetric memory 160 includes one or more memory systems where read characteristics have similar properties to the write characteristics. Examples of symmetric memory include DRAM, and other random access memory technologies.

The asymmetric memory 170 includes one or more memory systems where read characteristics and write characteristics are dissimilar. For example, some types of asymmetric memory have write latencies that are orders of magnitude greater than the read latencies. Examples of asymmetric memory may include NOR flash. With some types of asymmetric memory, an interface is used to (among other things) require an entire region of content to be rendered inaccessible to read requests whenever any constituent block of the region is written, for example, using an I/O block write, instead of a smaller, random access write to the specific update location.

In configurations where the memory system 150 resides in DIMM packaging, the DIMM may be configured to dynamically process read and write instructions. For example, in a read mode, one or more DIMMs may be configured to receive instructions to access content residing at a particular physical address, and provide requested content to the processor through the MC. Generally, in a write mode, the DIMM is configured to receive data to be written with a physical address. Depending on whether the physical address represents flash or DRAM, the data may be written in a random access manner (e.g., a word or byte) or in a block (e.g., a 4 Megabyte or a 4 kilobyte block). In one configuration, the DIMM is entirely made up of one type of memory (e.g., DRAM or NOR flash). In another implementation, the DIMM includes a hybrid of both DRAM and flash and relies on an internal or external MC to perform the different operations required to implement a hybrid memory system. And, although one or more configurations were described where a hybrid and/or dedicated configuration was used, a different configuration may be used.

Figure 2:
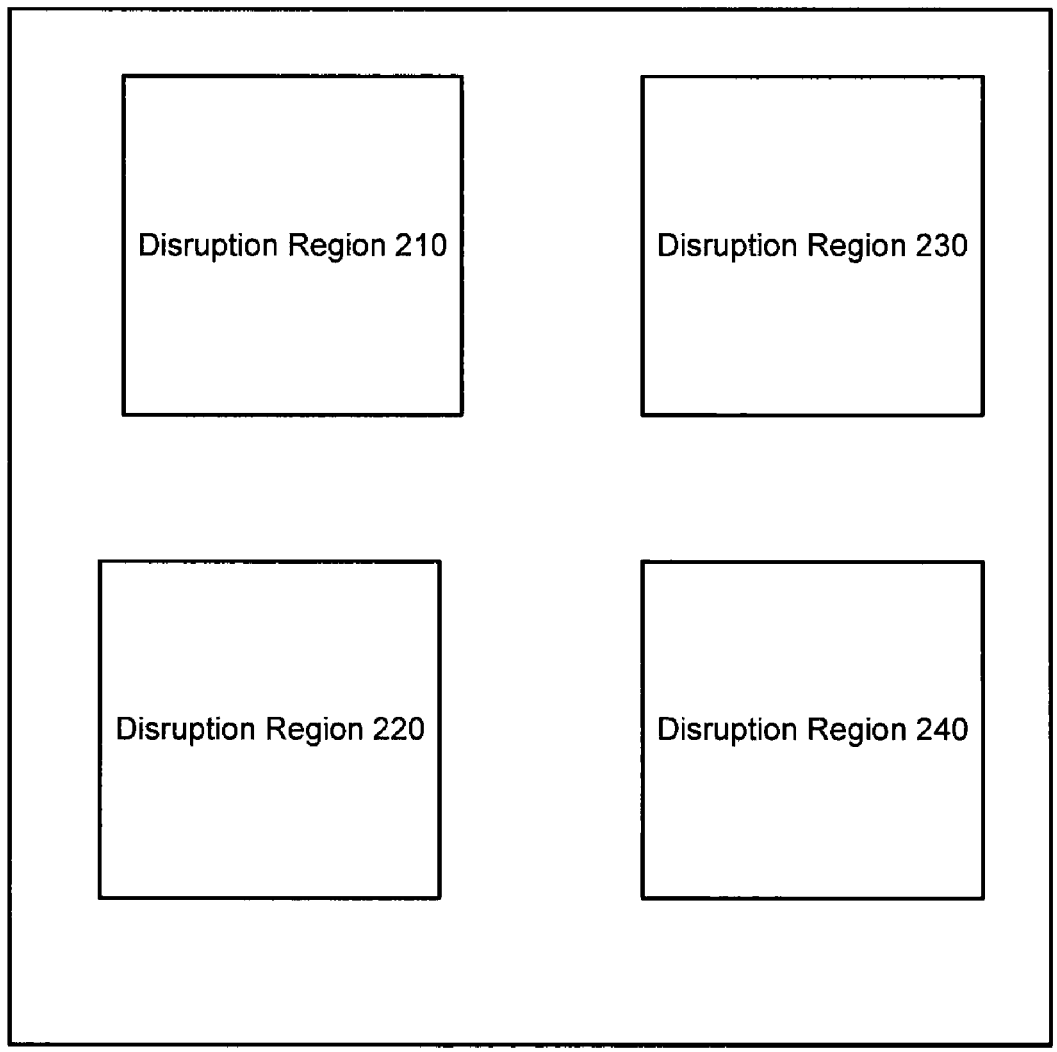
FIG. 2 is a block diagram of disruption regions in asymmetric memory.

FIG. 2 is a block diagram of the disruption regions in asymmetric memory 200. In asymmetric memory, disruption regions 210-240 represent four areas of memory where a write to one address in the region causes the proximate memory addresses to demonstrate disruptive behavior. In one instance, the disruption region represents other memory cells that rely on a common internal write controller within the asymmetric memory. In another instance, the disruption region represents a range of addresses, logically or physically grouped.

FIG. 3 is a block diagram of a remapping (remap) table 300 associated with a MC. As shown, the remapping table 300 includes a list of MMU-specified physical addresses 310 and a corresponding list of MC-specified physical addresses 320. Generally, the MMU-specified physical addresses refer to those addresses referenced by the MMU within the CPU. The list of MC-specified physical addresses represents the physical addresses within a memory system. As such, the MC is configured to process the MMU-specified physical address as an additional type of virtual address by mapping that address to the corresponding MC-specified physical address shown at reference numeral 320.

More specifically, the remapping table 300 illustrates how different physical addresses may be associated with a MMU-specified physical address, for example, based on whether the MMU provides a read or write instruction. As shown in the first entry, MMU-specified physical address 100 is associated with a read address 1100 and write address 2100. Similarly, MMU-specified physical address 200 is associated with read address 1110 and write address 3100. The remapping table 300 may be configured to associate different physical addresses based on whether the MMU (bus) address is associated with a disruption region.

In one configuration, the MC is configured to associate identically sized regions with both the read and write translations. Selection of a region size may have an impact on the "alignment" of addresses (e.g., contents of the lower bits in a physical address). Thus, using regions of a consistent size may permit the use of reduced complexity addressing operations as remapping operations are performed. For example, the addressing operations may be limited to modifications to certain portions of the address.

The remapping table may be implemented using a variety of structures. In one configuration, both the read/write translations are found in the same remapping table residing in a single, intermediary device. In another configuration, both the read/write translations are found in the same remapping table residing in a device residing on a DIMM. In yet another configuration, several integrated read/write translations are found within a single device, such as a configuration where a single remapping table is configured to support several banks within a DIMM and several remapping tables are used.

Alternatively, the read translation may be implemented as part of the memory logic while the table used for write translations is implemented as a software-managed table residing, for example, with an application, a hypervisor, an operating system, a CPU, or a MC. Multiple remapping tables for read and/or write translations may be used that reside in different locations, such as a MC, a DIMM or on multiple devices within a DIMM. A hierarchical structure of remapping tables may be used so that a MC includes a first remapping table that interfaces with a second remapping table that acts as the interface to several devices within a DIMM.

Figure 4:
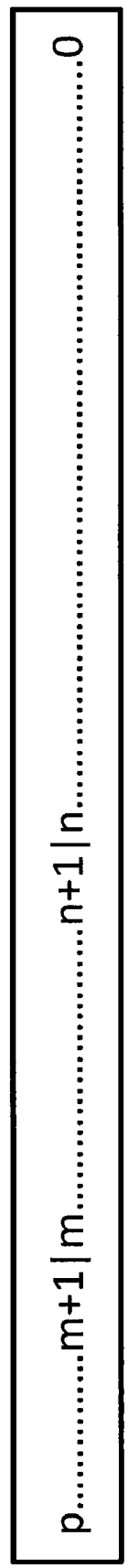
FIG. 4 is an illustration of an addressing format used by a memory controller.

FIG. 4 is an illustration of the addressing format 400 used by a MC. As shown in format 400, the physical address has 3 components. The low bits <n . . . 0> are the offset of the data within a given bank and sector. Bits <m . . . n+1> address a specific sector within a bank, and bits <p . . . m+1> address a specific bank within the memory subsystem. In one configuration of an individual flash chip, sectors may be allocated with 128K bytes, and there may be anywhere from 256 to 4096 sectors per bank and 1 to 16 banks per chip. The memory subsystem may additionally be designed such that a plurality of chips/modules are accessed in parallel with a single address, permitting a logical sector to be constructed from the aggregation of corresponding physical sectors in the plurality of chips/modules. The plurality of chips/modules may be used to increase <n>: the number of bits within a sector because each logical sector has additional storage for each address. Additional flash chips may be also aggregated within the memory subsystem but given different addresses. This also increases the number of banks <p . . . m+1> within the memory subsystem.

Figure 5:
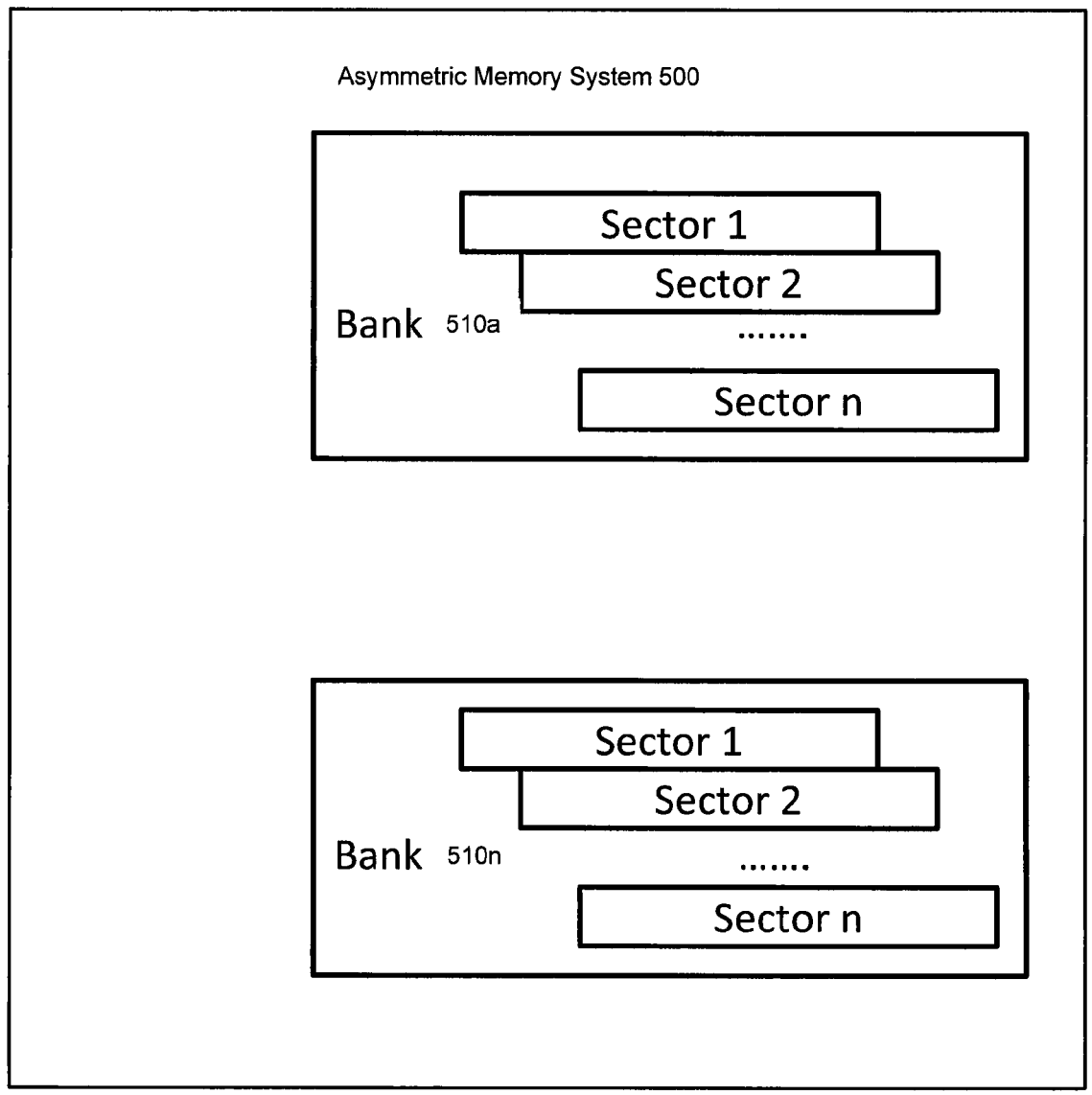
FIG. 5 is an illustration of banks and sectors within asymmetric memory.

FIG. 5 is an illustration of banks and sectors within asymmetric memory 500. More precisely, FIG. 5 shows the diagram of an example of an NOR flash chip. The NOR flash receives commands from the MC over a chip interface (not shown). A NOR flash chip includes a number of banks, as illustrated by banks 510a . . . bank 510n. Each bank includes a number of sectors <1 . . . n>. Each sector includes some number of words. The MC may be configured to directly address and read a specified word from any sector in any bank using, for example, random access instructions. As indicated above, writing data into NOR flash may be more problematic. That is, writing to NOR flash may require special operations to accommodate the particular access characteristics of NOR flash. First, in one configuration, the specific sector (for example, sector 2 in bank 510a) with the word to be written must be erased. Then, the "new" data may be written into the specified physical address within the sector. Other new data then may be added to a proximate location within the specified sector without requiring additional erases because the previous data residing at the proximate location was previously erased. Alternatively, due to some limitations in some configurations of NOR flash chips, if one sector (for example, sector 2 within a bank 510a) is being erased or written, data from the other sectors (1, 3 . . . n) within bank 510a are rendered contemporaneously unavailable for reading during the erase/write operation involving sector 2 of that bank 510a, while the other banks within the memory subsystem remain available for reading. In this case, the bank 510*a* represents an example of the disruption region.

FIG. 6 is a flow chart 600 of a process by which a MC enables access to a memory system that includes symmetric and asymmetric memory. More precisely, flow chart 600 illustrates a process by which a MC uses a remapping table in order to provide access to content in a memory system that includes asymmetric memory, where the remapping table includes physical addresses for storage in both symmetric and asymmetric memory. Alternatively, the remapping table in the MC may be configured to only interface with asymmetric memory and physical addresses associated with the asymmetric memory. Generally, the operations described in flow chart 600 are implemented on a system, such as the MC 130 described with respect to system 100. However, the operations may be performed by other systems in other contexts where a different architecture is being used.

Initially, a MC receives, from a MMU within a central processing unit (CPU), a request for an Input/Output (I/O) write to a first MMU-specified physical address (610). For example, the MMU may instruct the MC to write VALUE_A to MMU-specified physical address 1.

The MC accesses a remapping table associated with a MC (620). Accessing a memory table may include referencing a memory structure that maintains an association between a list of MMU-specified physical addresses and a list of MC-specified physical addresses.

The MC uses the remapping table to identify a first MC-specified physical address associated with the first MMU-specified physical address, the first MC-specified physical address corresponding to a first location within asymmetric memory storage (630). For example, the MC may lookup MMU-specified physical address 1 and determine that MC-specified physical address 1 refers to MC-specified physical address 101, an address that maps to asymmetric storage.

The MC may be configured to lookup the remapping table using 38-bit addressing offsets derived from 40-bit MMU physical addresses (in the range 0-256 GB). As a result of the lookup, the 40-bit MMU physical addresses are translated into 39-bit NOR Flash physical addresses.

An example of the translation may include a configuration where bits 37-29 of the addressing offset represent a 9-bit index in the remapping table. A lookup in the remapping table returns a 10-bit address. The 10-bit address becomes the high-order bits of the MC physical address. For example, a MMU physical address 0x0400001000 may get translated into memory-controller physical address 0x0840001000. An alternate memory-controller physical address the same range may be associated with is 0x0880001000.

More sophisticated translations are also possible. Specifically, a translation that combines a subset of the high-order bits with the low order bits may be used to generate multiple offsets into a collection of DIMM modules. For example, bits 37-31 of the addressing offset may be concatenated with bits 7-6 to obtain the 9-bit index into the remap table. In this configuration, MMU physical address 0x0400000080 may get translated into memory-controller physical address 0x0840000000. An alternate memory-controller physical address for the same range may be associated with address 0x0880000000.

The MC identifies a first bank of storage within the asymmetric memory storage that includes the first location, the first bank of storage including a disruption region that is associated with characteristics that include corrupted content or nondeterministic read latency as a result of attempting to read data from the first bank of storage as an I/O write is being performed that involves the first bank of storage (640). In one configuration (and as described in FIGS. 4 and 5), identifying the first bank of storage includes analyzing the MC-specified physical address to identify the bank. For example, in FIG. 5, bits <p . . . m+1> identify the bank. And in keeping with the example earlier introduced, when the MC-specified physical address of 0x0840001000 was identified, 0x84 is identified as the bank. The access characteristics for the disruption region need not necessarily cause a problem nor must the access characteristics be inconsistent. Rather, the disruption region relates to the potential for problematic access characteristics.

The MC then writes contents from the first bank of storage to a second bank of storage (650). For example, the MC may load 4 MB of data from a first bank (or block) on a chip (or collection of chips) to a second bank of chips (or a collection of chips). The second bank represents a different disruption region than the first bank. In addition to identifying a different disruption region, other criteria may be used to identify a different bank. For example, the MC may use a policy that minimizes a number of erases that are required, e.g., using a ping-pong scheme that returns to the same bank until storage in the bank is exhausted. Alternatively, the policy may be configured to identify another bank in the same physical device in order to minimize the cost of the data copy. If a write to block 1 caused the first bank to be written to the second bank, a read of a location in a second block (e.g., block 2), which is immediately adjacent to block 1 and which is within the same disruption region, continues to be serviced by bank 1 until the block 1 related write is completed to bank 2. Thereupon, reads to such locations of block 2 are serviced by the updated block 2 now available in bank 2. In other words, between a time when the contents from the first bank of storage begin to be written to the second bank of storage and before a time when the contents to be written have been written to the second bank of storage, read instructions from the MMU for requested content associated with a second MMU-specified physical address may be serviced by reading the requested content from the first bank of storage (660). Therefore, the MC may be configured to operate in two parallel modes in response to determining that the CPU is accessing content in the first bank. In a "read" mode, the MC is configured to process read instructions addressed to the first bank by reading from the first bank. In a "write" mode, the MC is configured to place the write instruction in a queue until the previous block write instruction has been initiated and/or completed. Particularly in applications where read instructions occur far more frequently than write instructions, the adverse impact on application performance may be reduced by configuring read instructions to be performed from a first bank while configuring write instructions to be queued.

The MC configures the remapping table to associate the first MMU-specified physical address with a second MC-specified physical address corresponding to the second bank of storage after determining that the contents have been written to the second bank of storage (670). That is, in response to determining that the data in the first bank has been written to the second bank, the MC now configures the remapping table to associate the MMU-specified physical address with the MC-specified physical addresses for the second bank.

Other operations that are not shown may be performed in conjunction with the operations shown in flow chart 600. For example, if the MC received instructions to write additional data into the second bank, the MC identifies another unused bank (e.g., bank 510*x* in FIG. 5) and copies the data from the second bank (e.g., bank 510*n*) into the third bank (e.g., bank 510*x*). The MC then may be configured to write the additional data into the third bank (e.g., bank 510*x*). Thus, in the original example where VALUE A is mapped first into <p ... m+1'> and the remapping table is reconfigured to map VALUE A into <p" ... m+1"> (writing VALUE A to the second bank), the second write operation results in VALUE A being mapped to <p''' ... m+1'''> in the third bank (bank 510*x*). Here, the third bank may be the first bank.

In one configuration, the system is configured to switch back-and-forth between a first bank and a second bank. As content is being written from a first bank to a second bank, the first bank and the second bank share all or nearly all of their data. Once an update is performed to one of the banks, however, or as the second bank is activated into service via changing the remapping table in the above-described configuration, the data added into the second bank may be copied back into the first bank, as a result of receiving a second write instruction or otherwise. Because the first bank retains the previously-stored data, the first bank then is reconfigured into a copy of the second bank with minimal updating. After the data added to the second bank is copied into the first bank, the data being written via the second write instruction is added into sectors within the first bank, and the remapping table is changed to map the MMU-specified physical address back into the first address (e.g., <p' ... m+1'>, where <p' ... m+1'> points back to the first bank). Thereupon, the new data (i.e., the data from the second write instruction) is added to the second bank, and the second bank again becomes a copy of the first bank. The copies and writes between the first and second banks may be repeated.

Insofar as the write operations only involve the writing of new data (e.g., an update) to a portion of a sector within the bank, the use of coordinated writes between aligned banks may be used to reduce the computational burden in transferring data between two different banks. That is, the amount of processing and burden involved with a block write from a first bank to a second bank may be reduced if the MC only must coordinate the update to a sector within a bank.

Figure 7B:
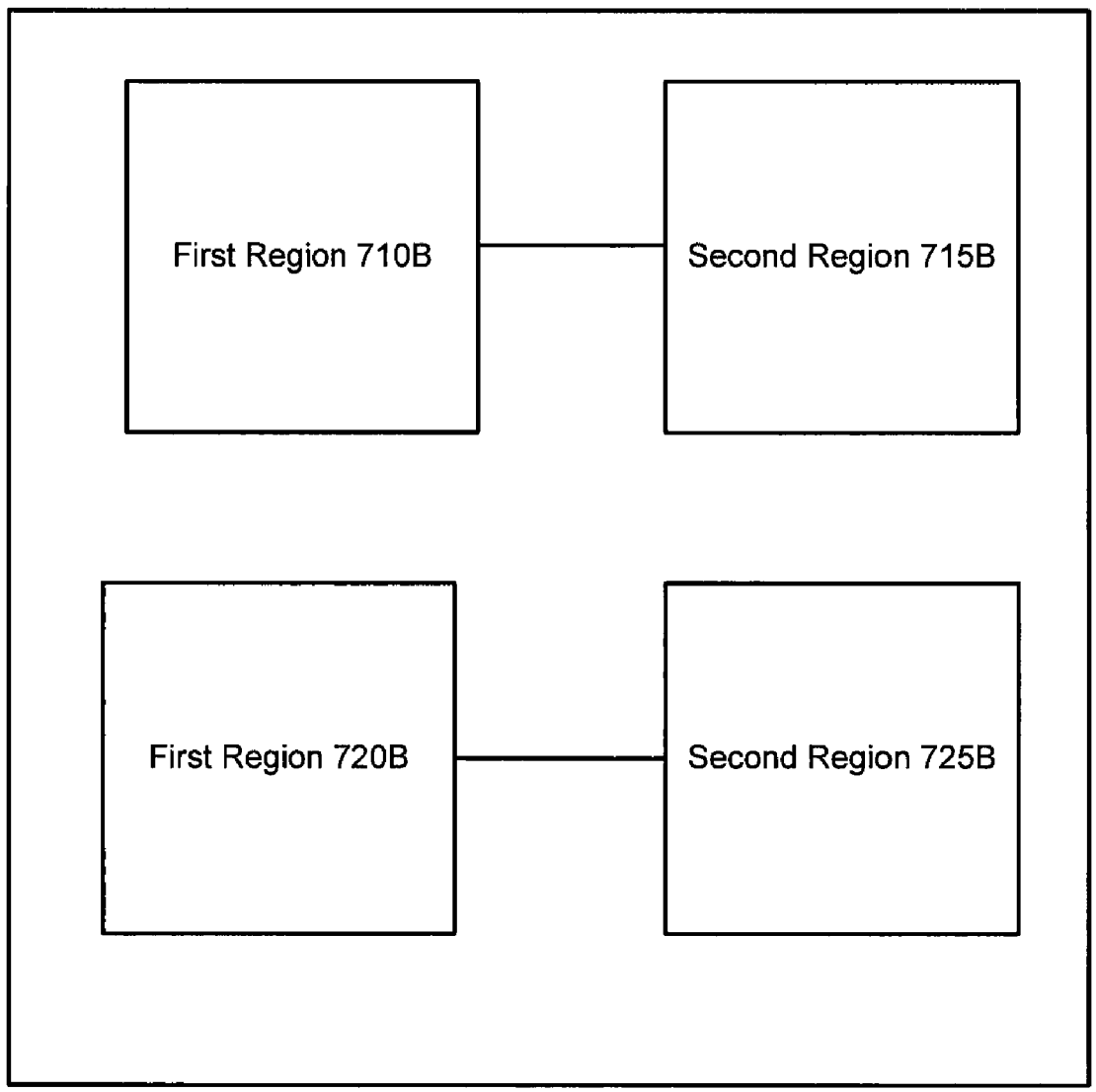
FIGS. 7B-7E are diagrams of different configurations for a memory system that aligns banks enabling asymmetric memory to be written in an efficient manner.
Figure 7C:
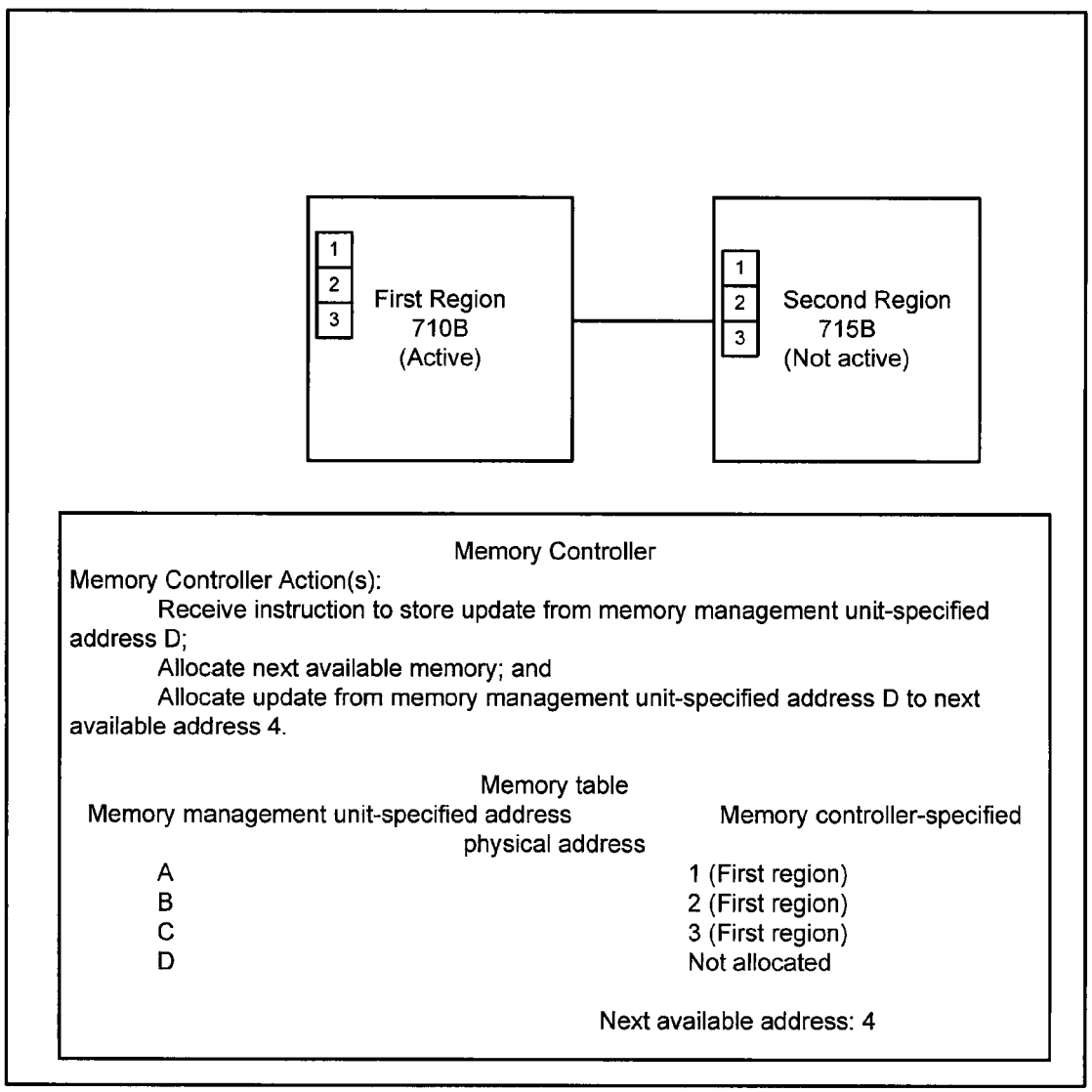
Figure 7D:
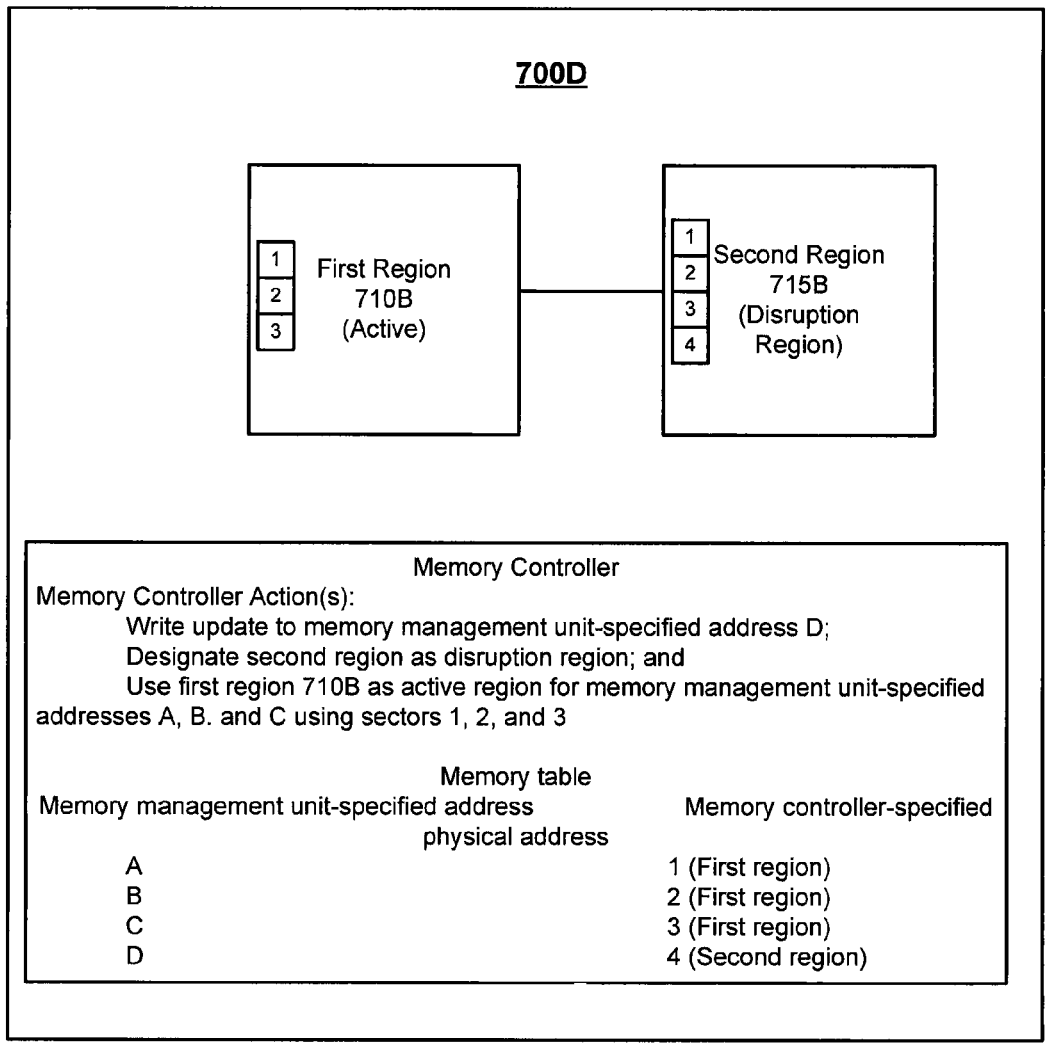
Figure 7E:
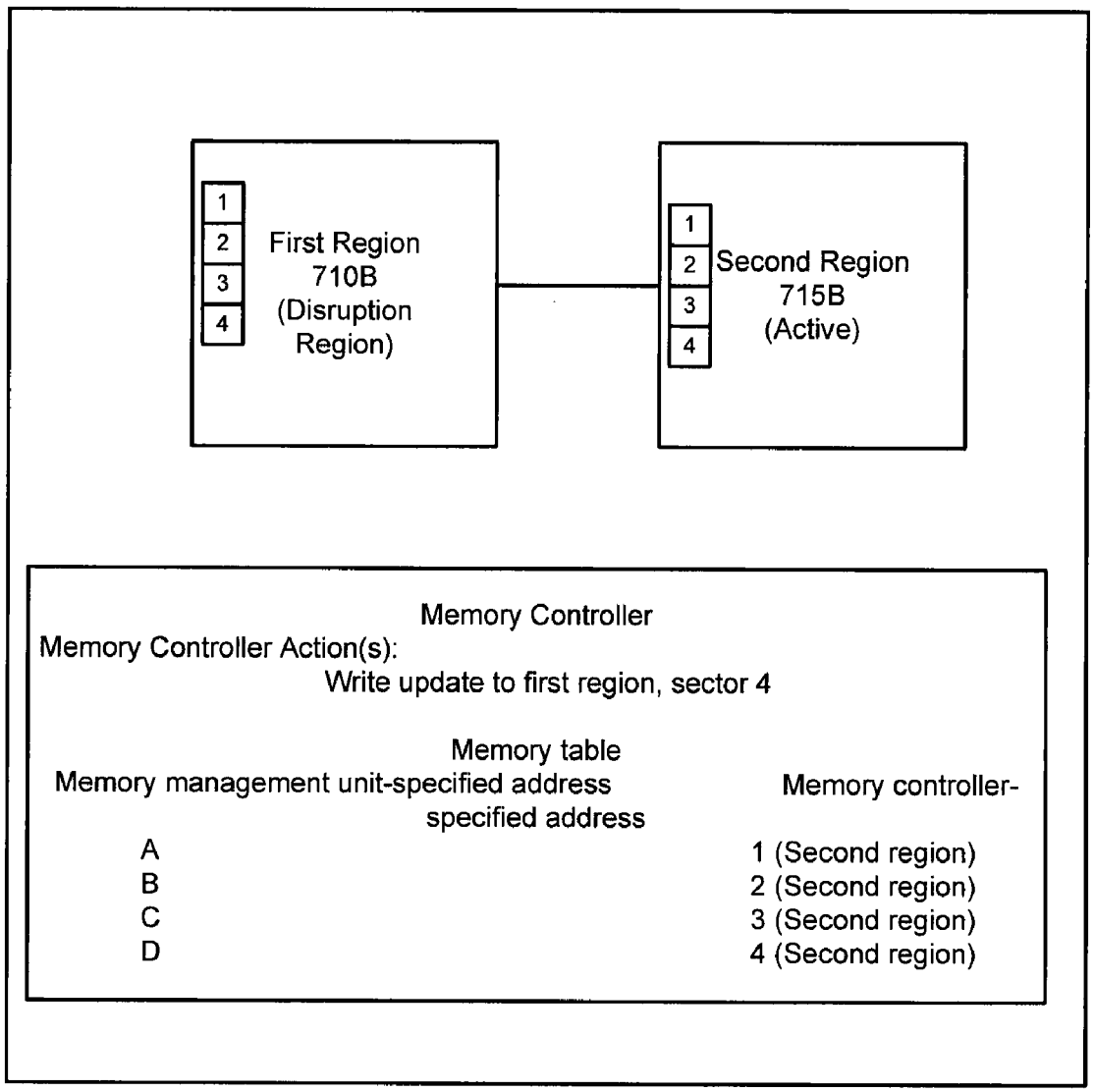

FIG. 7A is a flow chart 700A of a process by which data that is stored in a memory system that includes asymmetric memory is managed. More particularly, flow chart 700A illustrates a process by which the magnitude of write instructions are reduced by associating a first bank of asymmetric storage with the second bank of asymmetric storage, where at least some of the sectors in the first and second bank mirror one another. Although the operations described in flow chart 700A are described as being performed on a MC, such as the MC 130 described with respect to system 100, the operations shown in flow chart 700A may be performed on other systems. For example, the operations may be performed by other systems in other contexts where a different architecture is being used.

In any event, the MC identifies a first bank of asymmetric storage, the first bank representing a first disruption region (710A). For example, identifying a first bank of storage may include managing MC-specified physical addresses for a MC that includes NOR flash memory systems. A bank representing a disruption region may be identified by configuring the MC to use certain portions of the MC-specified physical addresses as an indication of the bank.

The MC identifies a second bank of asymmetric storage, the second bank representing a second disruption region that is separate from the first disruption region (720A). That is, either of the first or the second bank remains accessible for reads while the other bank is being written to. Note that a bank may represent a logical or physical region. For example, in one configuration, the bank represents a physical module. In another configuration, the bank represents a region within a chip. In still other configurations, the bank represents multiple regions across multiple chips.

The MC associates the first bank of asymmetric storage with the second bank of asymmetric storage, with a first sector, a second sector, and a third sector in the first bank, including data that mirrors data within a first sector, a second sector, and a third sector of the second bank (730A). The MC may be configured to coordinate reads and write operations so that writes always occur to one of the two banks, and so that one of the banks is available to support at least some read operations while the other bank is unavailable due to a write operation being performed.

The MC receives a first update to be written to the memory system (740A). Receiving an update may include receiving a command to update a data structure associated with a MMU-specified physical address (acting as a virtual address) with another entry and/or replacing a particular entry in the data structure at the MMU-specified physical address with an updated entry. Updating the data structure may include preparing a batch of writes to the data structure. For example, insofar as different and independent addresses are being updated, the MC may queue several operations. The writes (e.g., updates) need not be of the same size. A first write may relate to a record of a first size while a second write may relate to a record of a second size.

The MC writes the first update to a fourth sector of the second bank that follows the third sector of the first bank (750A). For example, the MC may determine that addresses 001-003 are being used in a first bank, and that the next available free space begins at address 004 (the fourth sector). Therefore, the MC instructs the second bank, fourth sector, to store the first update. In another example, the MC may determine that the fourth sector in a ten sector (001-010) search index needs to be updated with the first update. The MC instructs the second bank, fourth sector to store the update to the search index.

The MC disables read accesses to the first sector, the second sector, and the third sector of the second bank while writing the fourth sector to the second bank (760A). That is, the MC may be configured to protect an application from experiencing difficulties by disabling read access to the disruption region caused by writing the first update to the second bank.

The MC enables data to be read from the first sector, the second sector, and the third sector of the first bank while writing the update to fourth sector to the second bank (770A). Because the disruption region can be quite large (e.g., 1 Gigabyte), and the impact on an application of disrupting read access to a large amount of data may be severe, the MC may continue to provide read access to content otherwise unavailable due to the write operation being performed to the second bank. Therefore, since the first, second, and third sectors have not been changed, the MC may continue to provide application read access to those sectors using the first bank.

Thereafter, the MC writes the first update to the fourth sector of the first bank (780A). The MC disables read access to the first sector, the second sector, and the third sector of the first bank while writing the fourth sector to the first bank (790A). That is, because reading the first, second, and third sectors from the first bank may cause the previously-alluded to disruption, the potential for undesirable performance is reduced by disabling read access to those sectors from the first bank.

The MC enables data to be read from the first sector, the second sector, the third sector, and the fourth sector of the second bank while writing the update to the fourth sector to the first bank (795A). Thus, the first and second banks are now mirrored with identical (or substantially similar) data in each bank.

FIGS. 7B-7E are diagrams of different configurations 700B-700E for a memory system that aligns banks enabling asymmetric memory to be written in a more efficient manner. More precisely, memory systems 700B-700E illustrate how two regions (e.g., banks or disruption regions) may be aligned so that as content is written from a first bank to a second bank, the first bank enables read access to content within the first bank. As shown in configuration 700B, memory system 700B includes first region 710B, second region 715B, first region 720B, and second region 725B. Generally, first region 710B is aligned with second region 715B and first region 720B is aligned with second region 725B. Aligning a first region (e.g., a read region) with a second region (e.g., a write region) enables the MC to support read instructions while a write instruction is being performed to the write region. The designation of read and write labels to a region then is reversed once the data has been written from the read region to the write region.

Configuration 700C illustrates how a MC processes an instruction from the MMU relative to an internal remapping table and the configuration of first region 710B and second region 715B. In particular, Memory Controller Actions indicates that the MC has received an instruction to store an update for MMU-specified physical address D. As the instruction to store the update is received, first region 710B is active with three sectors (1, 2, 3), and second region 715 is not active, but mirrors the first region 710B with sectors 1, 2, and 3. As a result of receiving the instruction to store the update, the MC allocates the next available memory, which the MC indicates is MC-specified physical address, sector 4. The MC then allocates the update from MMU-specified physical address D to MC-specified physical address, sector 4.

Configuration 700D illustrates how the first region remains active to support requests for MMU-specified addresses A, B, and C from MC-specified physical addresses in first region 710B, sectors 1, 2, and 3. The second region 715B is now a disruption region as MMU-specified address D is being written to MC-specified physical addresses in second region 715B, sector 4.

Configuration 700E then illustrates a subsequent configuration where the second region becomes active to support requests for MMU-specified addresses A, B, C, and D from MC-specified physical addresses in second region 715B, sectors 1, 2, 3, and 4. The first region 710B is now a disruption region as MMU-specified address D is being written to MC-specified physical addresses in first region 710B, sector 4.

Figure 8B:
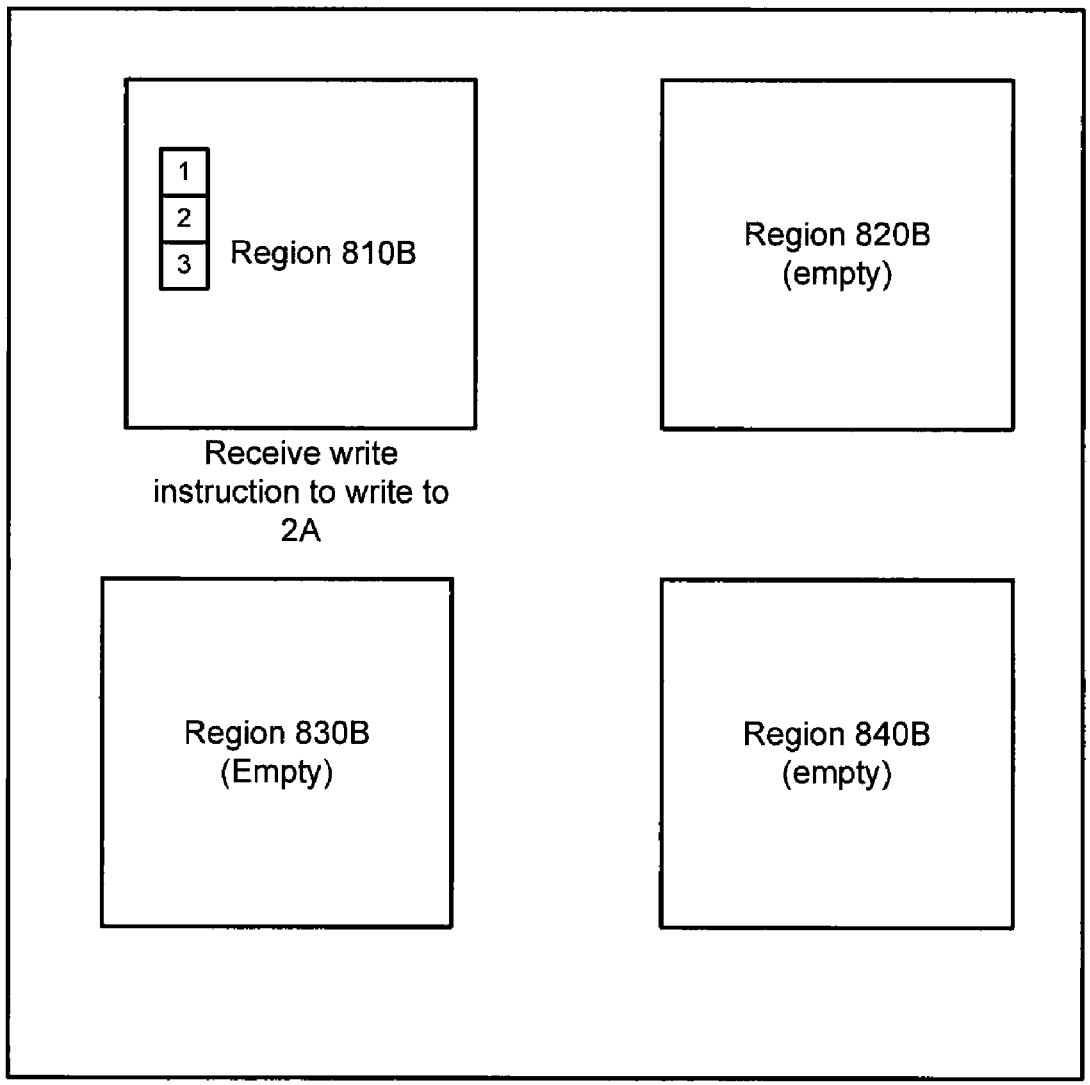
FIGS. 8B-8H are diagrams of different configurations for a memory system that copies data from a first region to a second region as an update to the data is being written to the second region.
Figure 8C:
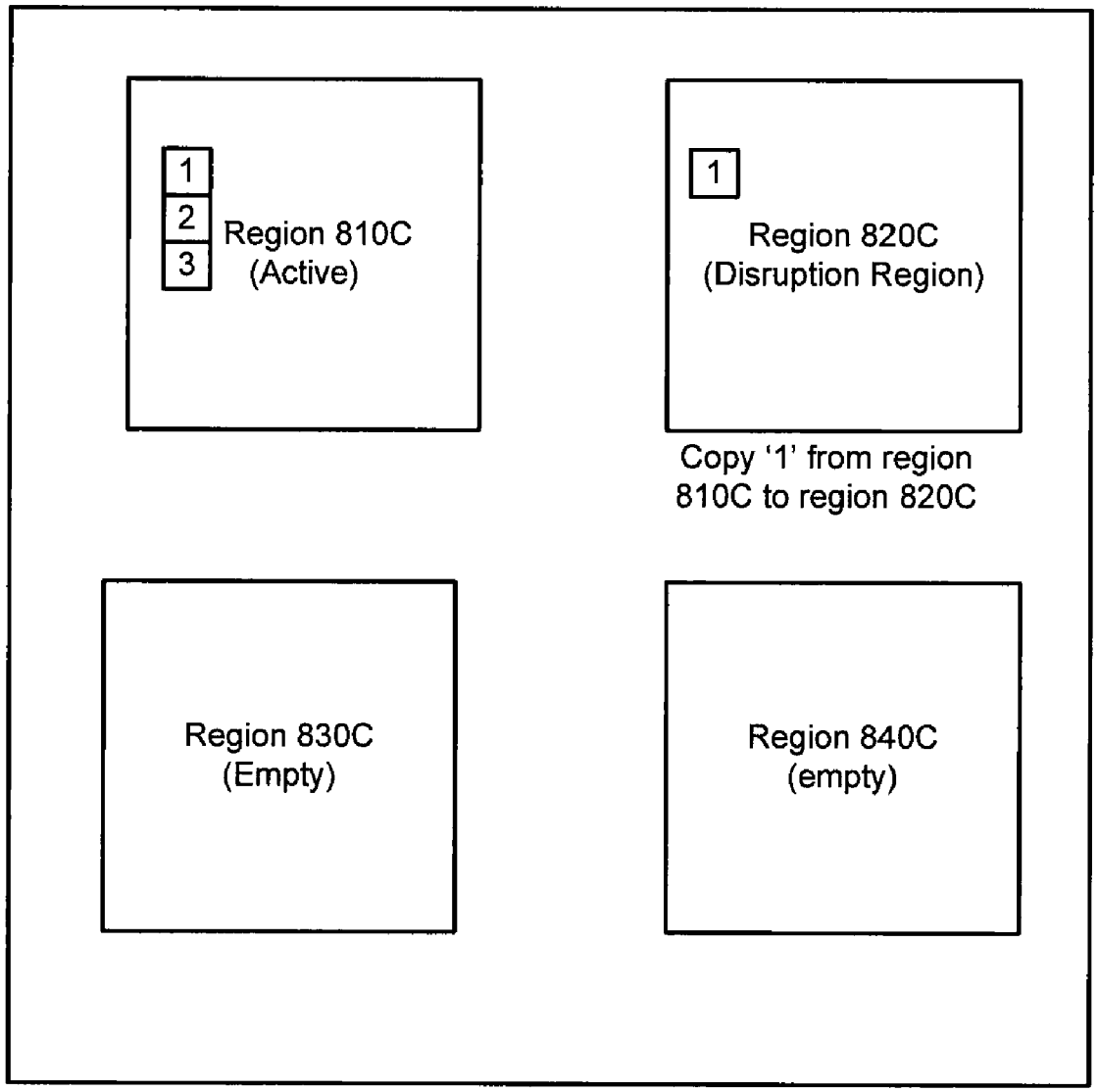
Figure 8D:
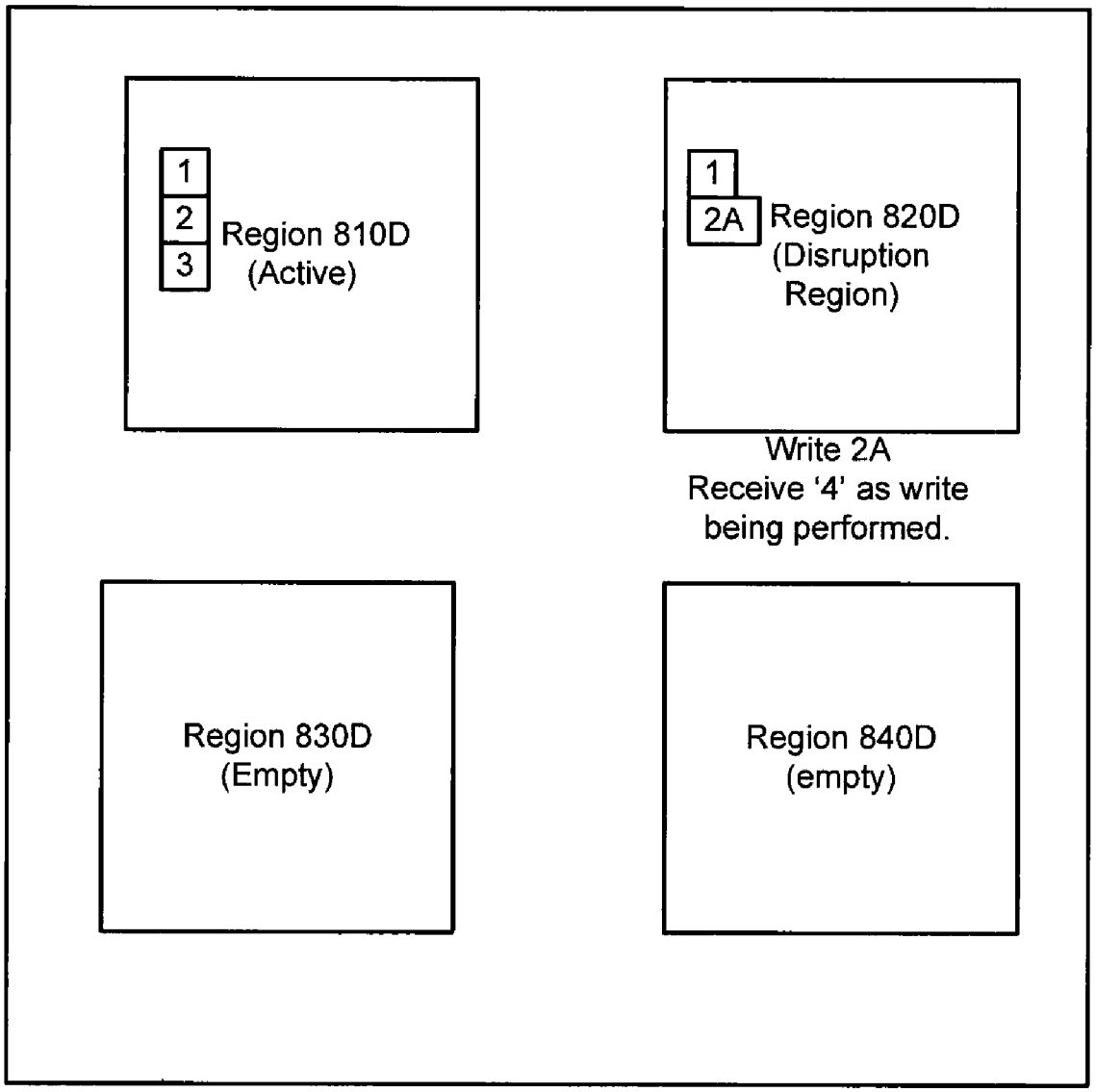
Figure 8E:
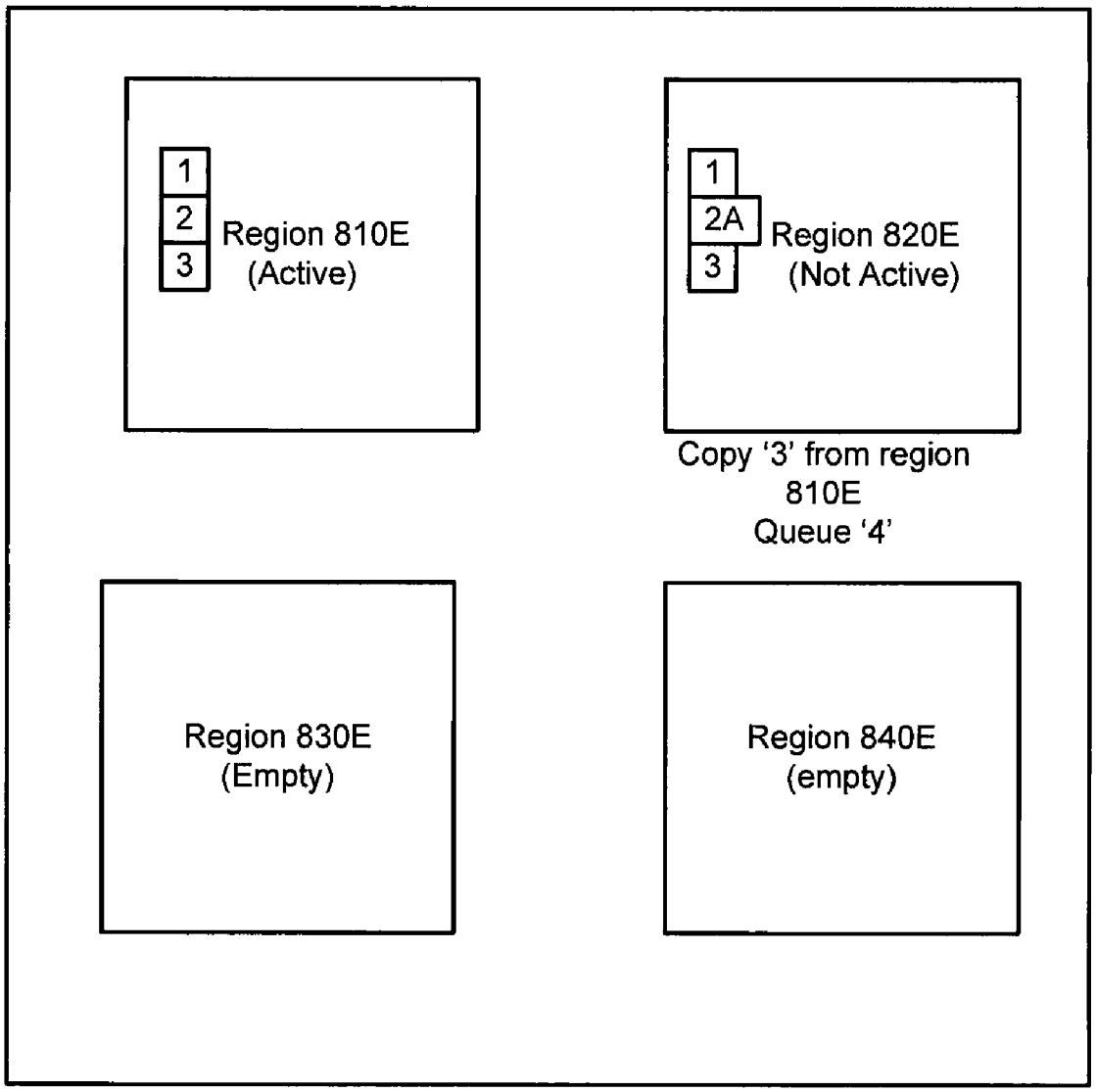

FIG. 8A is a flow chart 800A of a process by which data is queued in order to write the data to a memory system that includes asymmetric memory. Initially, a MC receives an instruction to write a value to a first MMU-specified physical address (810A). The MC determines that the first MMU-specified physical address is associated with a MC-specified physical address for asymmetric memory and queues the write instruction (820A). The MC then copies the data from a first region proximate to the MC-specified physical address that is an active region to a second region (830A). The MC then modifies the remapping table so that read access to the content of the first region is still enabled, and writes the value to the second region (840A). Alternatively, the first region may already be active for reading. Once the writing is completed, the MC reconfigures the remapping table to identify the second region as the active region for the content previously stored in the first region and the value associated with the first MMU-specified physical address (850A).

FIGS. 8B-8H are diagrams of different configurations 800B-800H for a memory system that copies data from a first region to a second region as an update to the data is being written to the second region. More precisely, configurations 800B-800H illustrate how a MC is configured to write the contents from an active region to a second region as a result of receiving a write instruction.

In configuration 800B, four regions (810B-840B) are shown with region 810B being active and regions 820B-840B being empty. Configuration 800B illustrates that '1', '2', and '3' are already stored in region 810B and that the MC has received a write instruction to write 2A to storage. Generally, labels such as '1', '2', and 2A refer to data that is stored or data that will be written into asymmetric memory. In one configuration, the label represents the data itself. In another configuration, the label represents a MC-specified address or a MMU-specified physical address.

Figure 8F:
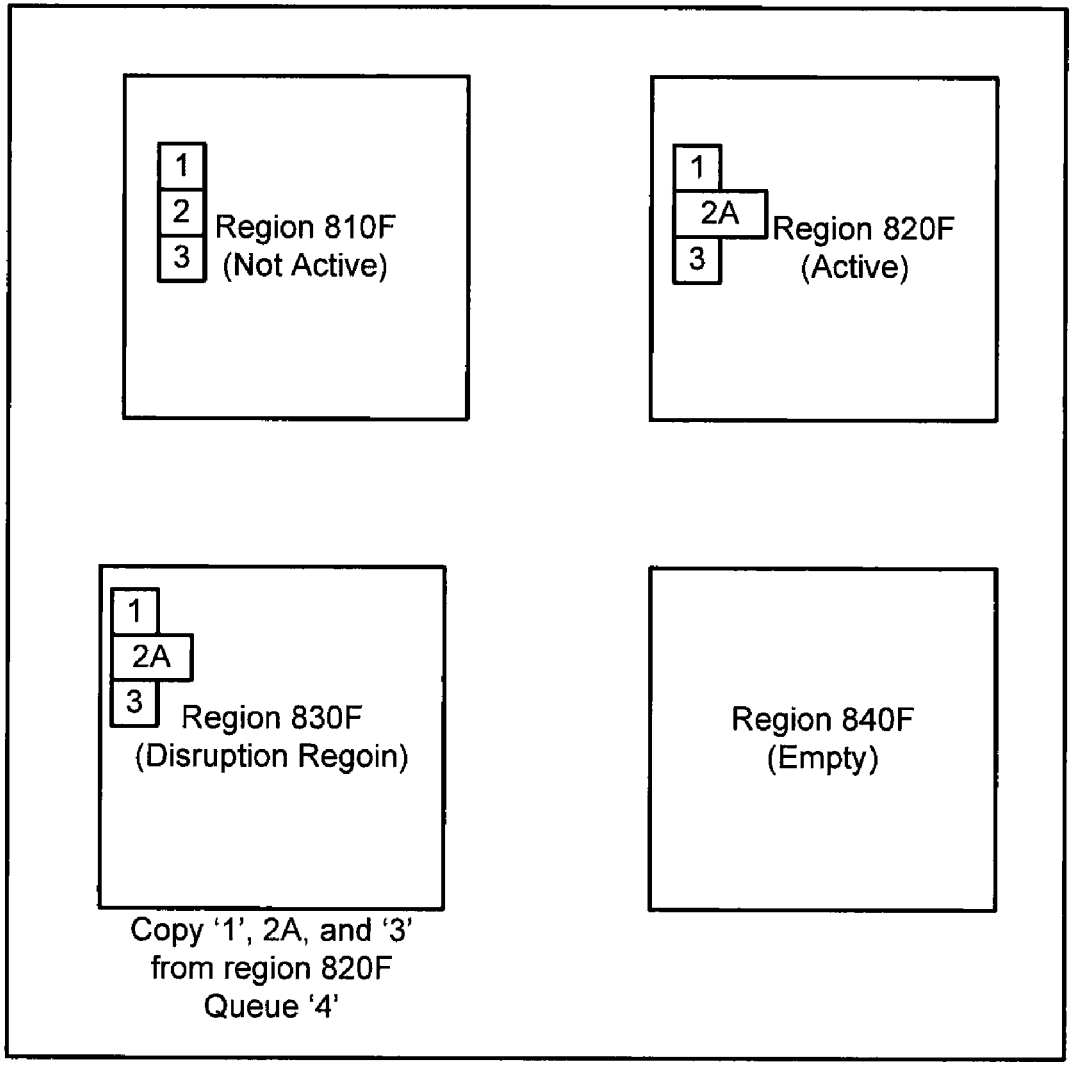
Figure 8G:
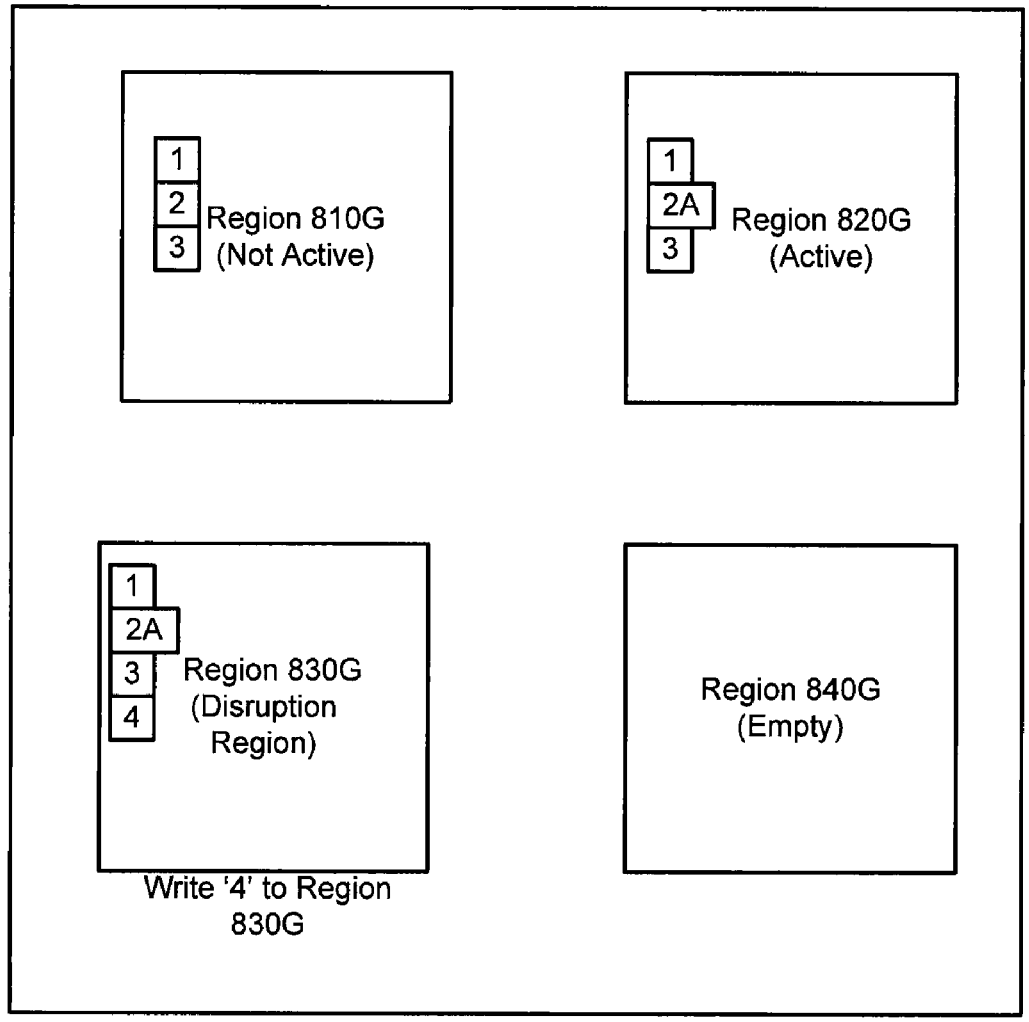
Figure 8H:
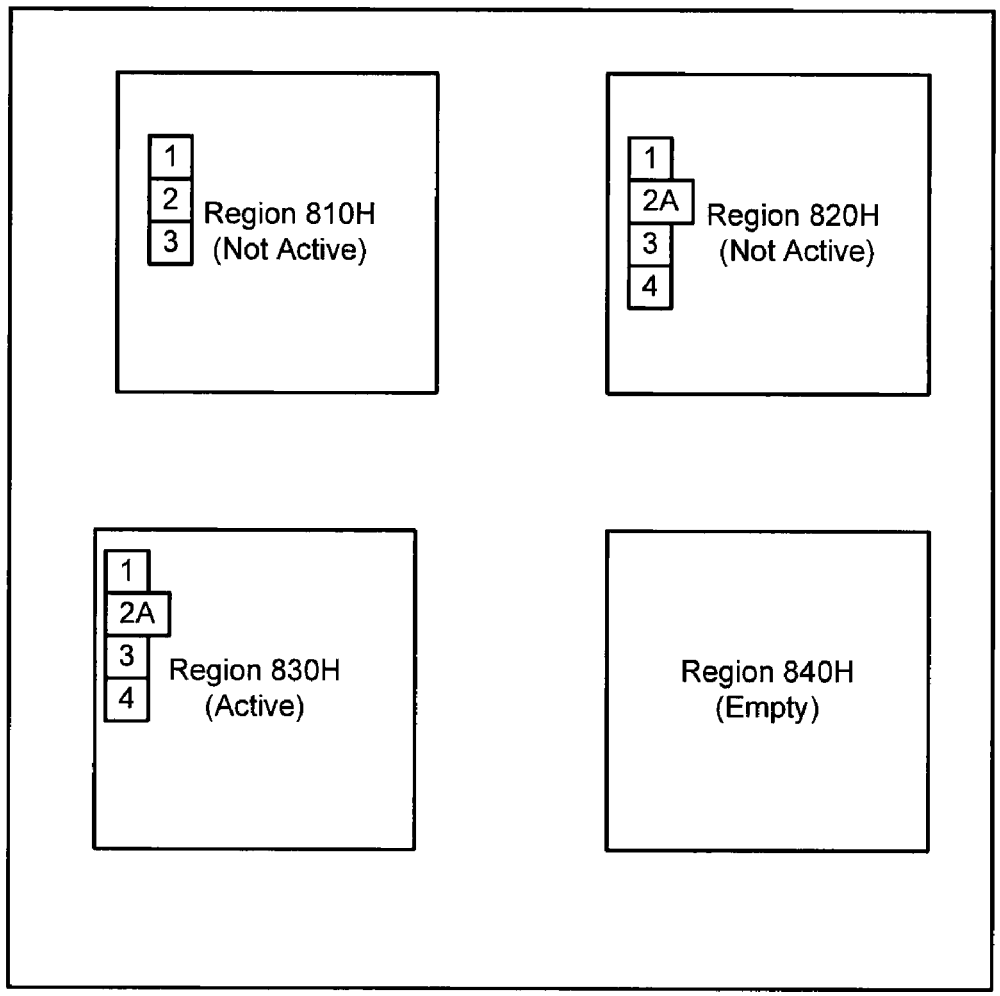

As a result of receiving the write instruction, configuration 800C illustrates a progression from configuration 800B where region 810C remains active to support access to '1', '2', and '3'. Configuration 800C illustrates that '1' has been copied from region 810C to region 820C and that region 820C is now identified as a disruption region (e.g., bank). In the next operation, in addition to writing '1' to region 820D, the MC writes 2A to region 820D. As the write is being performed, an instruction to write '4' is received. Because configuration 800D indicates that a write is being performed, the MC queues '4' in configuration 800E. Configuration 800E illustrates that the write has not yet been completed, and region 820E remains inactive as '3' is being copied to region 820E. As a result, region 810E remains active to support access to '1' and '3'. FIG. 8F indicates that region 820F is active after '3' has been copied to region 820F. In order to write '4', configuration 800F indicates that '1', 2A, and '3' are copied from region 820F to region 830F, where region 830F becomes a disruption region. In addition to copying '1', 2A, and '3' to region 830G, the MC writes '4' to region 830G. Once the write is complete, configuration 800H indicates that region 830H becomes active.

Other implementations are within the scope of the following claims. For example, although aspects of the system was described in the context of NOR flash with respect to using banks and sectors within the banks, the operations may be performed using other types of asymmetric memory with disruption regions (e.g., a NOR flash bank) and blocks (e.g., a NOR flash sector).

The characteristics of a disruption region may vary between different read operations performed that follows or is simultaneous with a write operation. For example, during a first simultaneous read/write operation to a disruption region, the content may be corrupted. The content may be delayed during a second simultaneous read/write operation, and a third simultaneous read operation may see the content corrupted and delayed. A fourth simultaneous read/write operation may include uncorrupted data received in a timely manner. However, notwithstanding uncorrupted and timely data, the memory controller may be configured to still operate as though an asymmetric memory component will operate in an adverse manner (e.g., corrupted data and latency).

Furthermore, although aspects of the flash memory subsystem previously described flash chips being mounted on DIMMs, other implementations may be used where the flash chips and controller are mounted on the same circuit board. While examples described configurations with flash memory DIMM, other configurations may use other non-volatile memory devices where the non-volatile memory device disables access to some data during the writing of other data within the device. In another example, a remapping table may be configured to manage the access between different banks within a memory subsystem. The remapping granularity may be finer or coarser either remapping chips (coarser) or even remapping sectors within banks (finer). The address remapping table previously described remaps bits <p ... m+1> into the same number of bits <p' ... m+1'>. Other configurations may remap into a larger or smaller number of bits <p' ... m+1'>.

Although many of the configurations were described with respect to NOR flash memory systems, the operations and configurations may be performed on other types of asymmetric memory, such as phase change memory (PCM). For example, PCM memory systems feature a 'precharge and write' mode, which includes a performance profile similar to the 'erase-and-write' sequence used by some types of NOR flash. Note that some types of PCM memory systems also feature an "overwrite" mode, which does not require an explicit "erase"-like operation that is used by some types of NOR flash memory systems. Note that in the "overwrite" operation used by some types of PCM memory systems, the write operation may still be associated with an application "cost" that is an order of magnitude higher compared to writing to DRAM. Thus, the operations described herein involving writes with larger block sizes also may be used for PCM memory systems that support "overwrite" mode.

In one configuration, a MC is configured to process a request for an I/O write by redundantly maintaining an active and an inactive instance of the same content in separate disruption regions that are associated with one another in order to reduce the computational burdens that may be caused by writing to asymmetric memory. For example, the MC may receive and process an I/O write by enabling continued read access while writing an update to the inactive instance of content. Upon writing the update to the inactive instance of content, the MC is configured to enable continued access to the content within the disruption region that was not updated in the write operation by leveraging the active instance of content and it may concurrently enable access to the content within the disruption region that has been updated in the write operation by leveraging the updated content in the other disruption region as also being active. Writing the update to the originally active disruption region may be immediate or it may be delayed by queuing the write of the update until such a time as the another I/O write is received or the impact of the I/O write on the application performance is reduced.

What is claimed is:

1. A method of enabling a memory controller associated with a remapping table to enable access to content in a memory system that includes asymmetric memory, the method comprising:
    receiving, at the memory controller, a request for an Input/Output (I/O) write to a first memory management unit-specified physical address;
    accessing a remapping table associated with a memory controller;
    using the remapping table to identify a first memory controller-specified physical address associated with the first memory management unit-specified physical address, the first memory controller-specified physical address corresponding to a first location within asymmetric memory storage;
    identifying a first disruption region within the asymmetric memory storage that includes the first location;
    writing contents from the first disruption region to a second disruption region;
    configuring the memory controller to process, between a time when the contents from the first disruption region begin to be written to the second disruption region and before a time when writing of the contents to be written to the second disruption region has been completed, read instructions from the memory management unit for requested content associated with a second memory management unit-specified physical address that is associated with the disruption region for the first memory-management unit specified physical address by reading the requested content from the first disruption region; and
    configuring the remapping table to associate the first memory management unit-specified physical address with a second memory controller-specified physical address corresponding to the second disruption region after determining that the contents have been written to the second disruption region, wherein the first disruption region and the second disruption region include physical addresses that are associated with characteristics that include corrupted content or nondeterministic read latency as a result of attempting to read data from the physical addresses concurrent with an I/O write being performed involving the physical addresses.

2. The method of claim 1 further comprising processing the request for the I/O write by writing data associated with the request for the I/O write to the second disruption region.

3. The method of claim 1 further comprising configuring the memory controller to process write instructions, from the memory management unit, to write to the second disruption region until a prior write operation has been completed.

4. The method of claim 1 further comprising leveraging the memory controller to align the first disruption region and the second disruption region including:
    after the data in the first disruption region has been written to the second disruption region, using the memory controller to write at least data newly-written to the second disruption region and distinct of data within the first disruption region to the first disruption region, and
    using the memory controller to process read instructions, as the data from the second disruption region is being written to the first disruption region, from the memory management unit for data residing in the first disruption region by reading from the second disruption region until the contents have been written to the first disruption region.

5. The method of claim 1 further comprising leveraging the memory controller to align the first disruption region and the second disruption region so that transferring the data between the first disruption region and the second disruption region only reflects the content that has been updated.

6. The method of claim 1 further comprising:
    receiving, at the memory controller from the memory management unit, a write instruction related to data that resides in the first disruption region;
    queuing the write instruction until the contents have been written to the second disruption region; and
    executing the write instruction in response to determining that the contents have been written to the second disruption region.

7. The method of claim 1, further comprising:
    identifying, in the memory controller, two memory controller-specified physical addresses for the memory management unit-specified physical address as the data in the first disruption region is being written to the second disruption region;

using a first memory controller-specified physical address associated with the first disruption region to process read instructions for data associated with the memory management unit-specified physical address; and using the second memory controller-specified physical address associated with the second disruption region to process write instructions for data associated with the memory management unit-specified physical address.

8. The method of claim 7 further comprising:

detecting that the write instruction to the second memory controller-specified physical address is associated with a disruption region; and queuing the write instruction to the second memory controller-specified physical address until the second memory controller-specified physical address no longer represents a disruption region.

9. The method of claim 1 further comprising:

exchanging, using the memory controller, asymmetric memory physical address information for the memory system across an interconnection; and automatically loading the requested data, using the asymmetric memory physical address information across the interconnection, in response to receiving a read instruction from the memory management unit.

10. The method of claim 1 wherein receiving, at the memory controller, the request for the Input/Output (I/O) write from the memory management unit-specified physical address includes:

receiving the request for the I/O write on a Dual Inline Memory Module (DIMM); and routing the request for the I/O block write to a memory controller embedded within the DIMM.

11. The method of claim 1 wherein identifying the first disruption region includes identifying multiple areas of organized memory across multiple areas on a single device.

12. The method of claim 1 wherein identifying the first disruption region includes identifying multiple areas on multiple devices that are organized around a memory controller-specified physical address in the remapping table.

13. The method of claim 1 wherein accessing a remapping table associated with a memory controller includes:

accessing a read translation table that is physically coupled to the asymmetric memory to exchange the first memory controller-specified physical address, and accessing a write translation table that is physically coupled to the asymmetric memory to exchange the first memory controller-specified physical address.

14. The method of claim 1 wherein accessing a remapping table associated with the memory controller includes:

accessing a read translation table that is physically coupled to the asymmetric memory to exchange the first memory controller-specified physical address, and accessing a write translation table that is stored in a different location than the read location table, where the read translation table is physically coupled to the asymmetric memory to exchange the first memory controller-specified physical address.

15. The method of claim 14 wherein accessing the remapping table associated with the memory controller includes:

accessing a read translation portion of the remapping table that is implemented as part of the memory controller logic to perform read operations, and accessing a write translation portion of the remapping table that is implemented as a software-managed table in order to perform write operations.

16. The method of claim 15 wherein accessing the write translation portion of the remapping table that is implemented as the software-managed table in order to perform write operations includes accessing the write translation portion of the remapping table that is implemented in association with an application, a hypervisor, an operating system, a CPU, or a memory controller.

17. The method of claim 1 wherein accessing a remapping table associated with a memory controller includes accessing the remapping table that is embedded as a DIMM-based memory controller.

18. The method of claim 1 wherein accessing a remapping table associated with a memory controller includes accessing several divided tables, where each of the divided tables are associated with two or more disruption regions within a DIMM.

19. The method of claim 1 wherein receiving, at the memory controller, the request for the Input/Output (I/O) write to the first memory management unit-specified physical address includes receiving, at the memory controller and from the memory management unit within the central processing unit (CPU), the request for an Input/Output (I/O) write to the first memory management unit-specified physical address.

20. The method of claim 1 wherein receiving, at the memory controller, the request for the Input/Output (I/O) write to the first memory management unit-specified physical address includes receiving, at the memory controller and from a system different than the memory management unit within the central processing unit (CPU), the request for an Input/Output (I/O) write to the first memory management unit-specified physical address.

21. The method of claim 1 further comprising configuring the memory controller to interface with symmetric memory and the asymmetric memory.

22. The method of claim 1 further comprising configuring the memory controller to interface with only the asymmetric memory.

23. The method of claim 1 further comprising configuring the memory controller to operate in a distributed mode, wherein the memory controller is configured to:

perform read translations using memory controller logic, and perform write operations using a portion of the remapping table implemented as a software-managed table residing with an application, a hypervisor, an operating system, a CPU, or a memory controller.

24. The method of claim 1 wherein the asymmetric memory includes NOR flash memory and wherein using the remapping table to identify the first memory controller-specified physical address associated with the first memory management unit-specified physical address, the first memory controller-specified physical address corresponding to the first location within the asymmetric memory storage includes using the remapping table to identify the first memory controller-specified physical address associated with the first memory management unit-specified physical address, the first memory controller-specified physical address corresponding to the first location within the NOR flash memory.

25. The method of claim 1 wherein the asymmetric memory includes phase change memory and wherein using the remapping table to identify the first memory controller-specified physical address associated with the first memory management unit-specified physical address, the first memory controller-specified physical address corresponding to the first location within the asymmetric memory storage includes using the remapping table to identify the first memory controller-specified physical address associated with the first memory management unit-specified physical address, the first memory controller-specified physical address corresponding to the first location within the phase change memory.

26. This method of claim 1 wherein:
the first disruption region includes a first bank within NOR flash memory and the second disruption region includes a second bank within the NOR flash memory, and
wherein identifying a first disruption region includes identifying the first bank within the NOR flash memory.

27. A system that enables a memory controller associated with a remapping table to enable access to content in a memory system that includes asymmetric memory, the system comprising:
means for receiving, at the memory controller, a request for an Input/Output (I/O) write to a first memory management unit-specified physical address;
means for accessing a remapping table associated with a memory controller;
means for using the remapping table to identify a first memory controller-specified physical address associated with the first memory management unit-specified physical address, the first memory controller-specified physical address corresponding to a first location within asymmetric memory storage;
means for identifying a first disruption region within the asymmetric memory storage that includes the first location;
means for writing contents from the first disruption region to a second disruption region;
means for configuring the memory controller to process, between a time when the contents from the first disruption region begin to be written to the second disruption region and before a time when writing of the contents to be written to the second disruption region has been completed, read instructions from the memory management unit for requested content associated with a second memory management unit-specified physical address that is associated with the disruption region for the first memory-management unit specified physical address by reading the requested content from the first disruption region; and
means for configuring the remapping table to associate the first memory management unit-specified physical address with a second memory controller-specified physical address corresponding to the second disruption region after determining that the contents have been written to the second disruption region, wherein the first disruption region and the second disruption region include physical addresses that are associated with characteristics that include corrupted content or nondeterministic read latency as a result of attempting to read data from the physical addresses concurrent with an I/O write being performed involving the physical addresses.

28. A system that enables a memory controller associated with a remapping table to enable access to content in a memory system that includes asymmetric memory, the system comprising:
a processor; and
a memory controller that is configured to:
receive, at the memory controller, a request for an Input/Output (I/O) write to a first memory management unit-specified physical address;
access a remapping table associated with a memory controller;
use the remapping table to identify a first memory controller-specified physical address associated with the first memory management unit-specified physical address, the first memory controller-specified physical address corresponding to a first location within asymmetric memory storage;
identify a first disruption region within the asymmetric memory storage that includes the first location;
write contents from the first disruption region to a second disruption region;
configure the memory controller to process, between a time when the contents from the first disruption region begin to be written to the second disruption region and before a time when writing of the contents to be written to the second disruption region has been completed, read instructions from the memory management unit for requested content associated with a second memory management unit-specified physical address that is associated with the disruption region for the first memory-management unit specified physical address by reading the requested content from the first disruption region; and
configure the remapping table to associate the first memory management unit-specified physical address with a second memory controller-specified physical address corresponding to the second disruption region after determining that the contents have been written to the second disruption region, wherein the first disruption region and the second disruption region include physical addresses that are associated with characteristics that include corrupted content or non-deterministic read latency as a result of attempting to read data from the physical addresses concurrent with an I/O write being performed involving the physical addresses.

29. A computer program product on a non-transitory computer readable medium, the computer program product enabling a memory controller associated with a remapping table to enable access to content in a memory system that includes asymmetric memory and comprising instructions that when executed on a processor cause the processor to perform operations that include:
receiving, at the memory controller, a request for an Input/Output (I/O) write to a first memory management unit-specified physical address;
accessing a remapping table associated with a memory controller;
using the remapping table to identify a first memory controller-specified physical address associated with the first memory management unit-specified physical address, the first memory controller-specified physical address corresponding to a first location within asymmetric memory storage;
identifying a first disruption region within the asymmetric memory storage that includes the first location;
writing contents from the first disruption region to a second disruption region;
configuring the memory controller to process, between a time when the contents from the first disruption region begin to be written to the second disruption region and before a time when writing of the contents to be written to the second disruption region has been completed, read instructions from the memory management unit for requested content associated with a second memory management unit-specified physical address that is associated with the disruption region for the first memory-management unit specified physical address by reading the requested content from the first disruption region; and configuring the remapping table to associate the first memory management unit-specified physical address with a second memory controller-specified physical address corresponding to the second disruption region after determining that the contents have been written to the second disruption region, wherein the first disruption region and the second disruption region include physical addresses that are associated with characteristics that include corrupted content or nondeterministic read latency as a result of attempting to read data from the physical addresses concurrent with an I/O write being performed involving the physical addresses.

* * * * *